(12) United States Patent
Shima

(10) Patent No.: US 8,674,437 B2
(45) Date of Patent: Mar. 18, 2014

(54) SEMICONDUCTOR DEVICE AND METHOD FOR MANUFACTURING SEMICONDUCTOR DEVICE

(71) Applicant: Fujitsu Semiconductor Limited, Yokohama (JP)

(72) Inventor: Masashi Shima, Kuwana (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/733,543

(22) Filed: Jan. 3, 2013

(65) Prior Publication Data

US 2013/0181288 A1    Jul. 18, 2013

(30) Foreign Application Priority Data

Jan. 17, 2012    (JP) .................................. 2012-007286

(51) Int. Cl.
*H01L 29/66*    (2006.01)
*H01L 21/336*    (2006.01)
*H01L 29/78*    (2006.01)

(52) U.S. Cl.
CPC ...... *H01L 29/7817* (2013.01); *H01L 29/66681* (2013.01)
USPC .......................................... 257/336; 438/286

(58) Field of Classification Search
CPC ............................................ H01L 29/66681
USPC ........................................................ 257/336
See application file for complete search history.

(56) References Cited

U.S. PATENT DOCUMENTS

| 2007/0034985 | A1 | 2/2007 | Matsudai et al. | |
| 2009/0065862 | A1 | 3/2009 | Matsudai et al. | |
| 2010/0244106 | A1* | 9/2010 | Parker et al. | 257/288 |
| 2011/0233687 | A1* | 9/2011 | Shima | 257/402 |
| 2012/0049279 | A1* | 3/2012 | Shrivastava et al. | 257/347 |
| 2012/0181619 | A1* | 7/2012 | Yang et al. | 257/370 |
| 2012/0193709 | A1* | 8/2012 | Sukegawa et al. | 257/337 |
| 2013/0020639 | A1* | 1/2013 | Thompson et al. | 257/338 |
| 2013/0181288 | A1* | 7/2013 | Shima | 257/336 |

FOREIGN PATENT DOCUMENTS

| JP | 07-161987 A | 6/1995 |
| JP | 2007-049039 A | 2/2007 |
| JP | 2011-199153 A | 10/2011 |

* cited by examiner

*Primary Examiner* — Matthew Landau
*Assistant Examiner* — Igwe U Anya
(74) *Attorney, Agent, or Firm* — Westerman, Hattori, Daniels & Adrian, LLP

(57) ABSTRACT

A semiconductor device including a gate electrode formed over a first region of a semiconductor substrate of a first conduction type; a source region and a drain region of the first conduction type formed on both sides of the gate electrode; a channel dope layer of a second conduction type formed in at least a region on a side of the source region of a channel region, the channel dope layer having a concentration gradient of a concentration of a dopant impurity of the second conduction type, which decrease toward the drain region; a first well of the second conduction type having a concentration gradient of a concentration of a dopant impurity of the second conduction type, which decrease toward the drain region; and a second well of the second conduction type formed in the first region, connected to the first well and positioned below the first well.

10 Claims, 29 Drawing Sheets

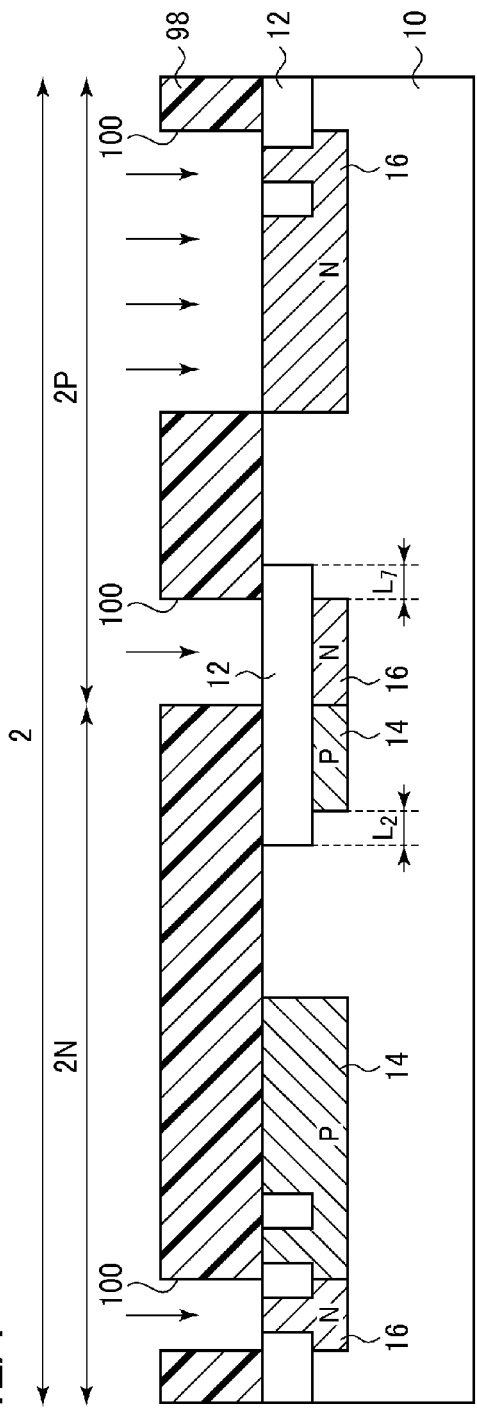
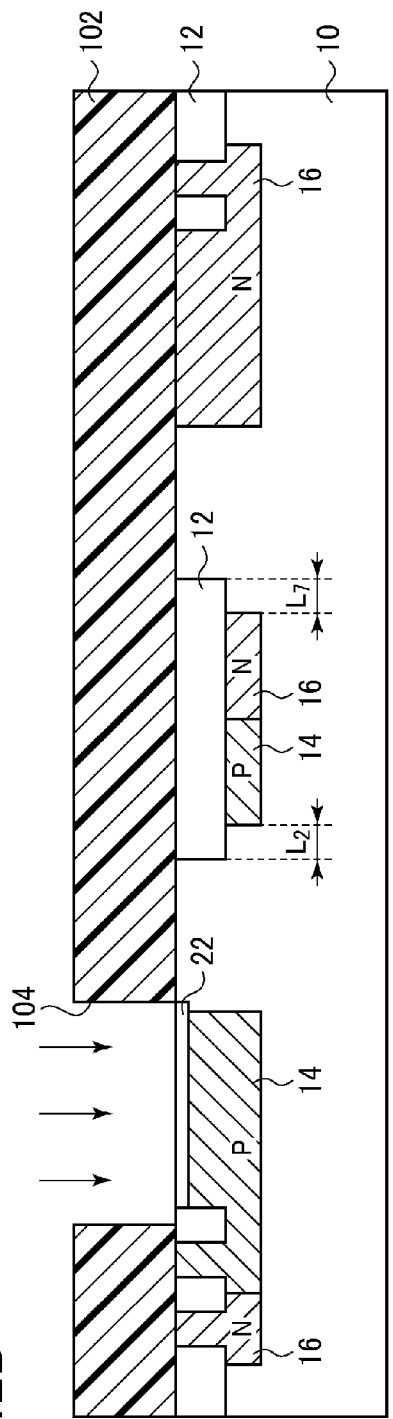
FIG. 12A
FIG. 12B

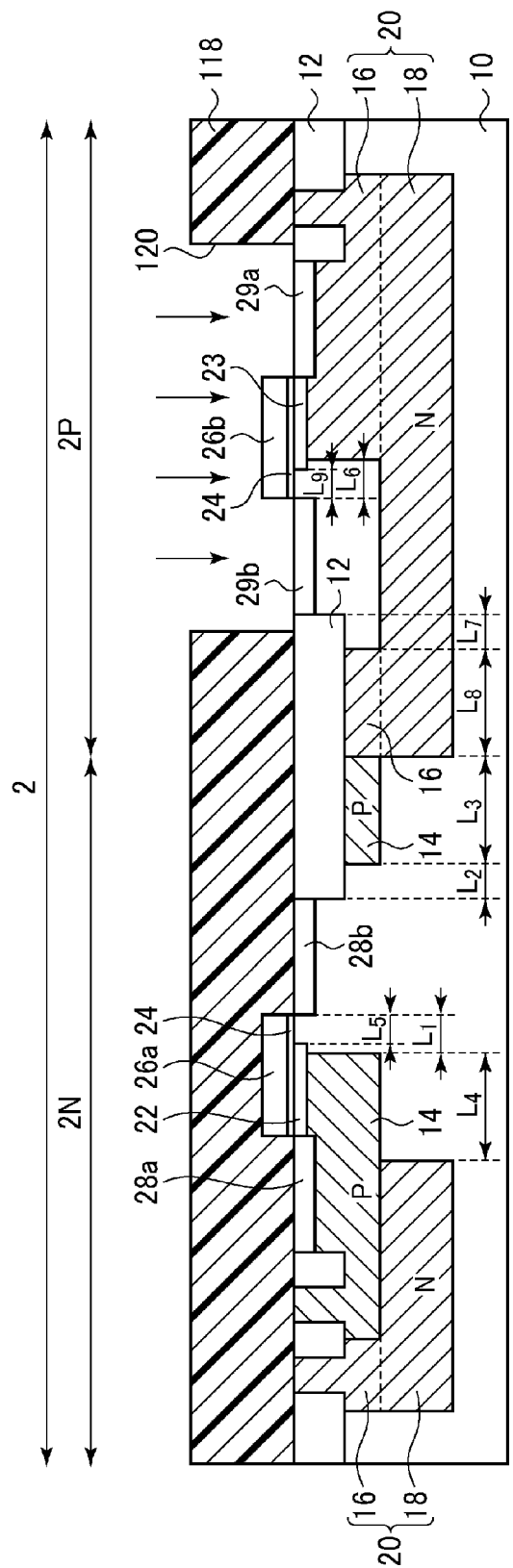
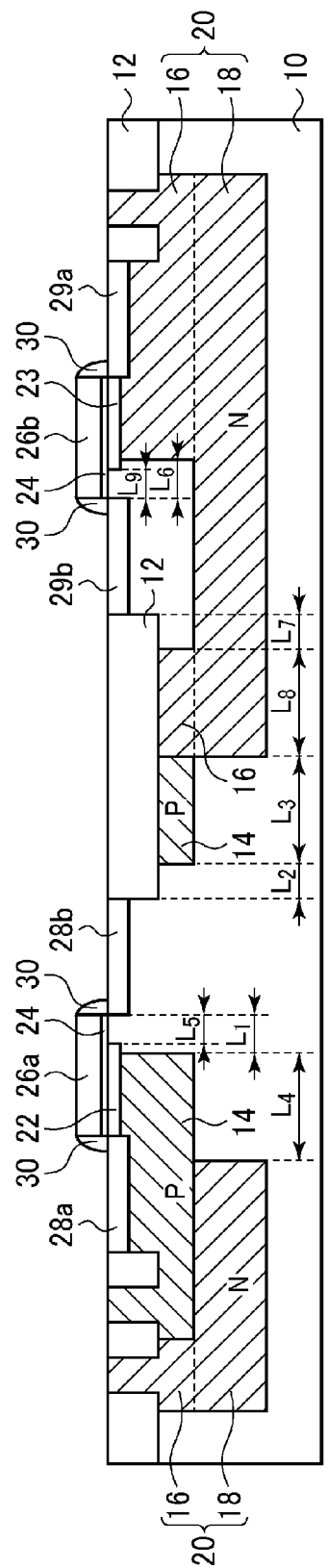
FIG. 15A
FIG. 15B

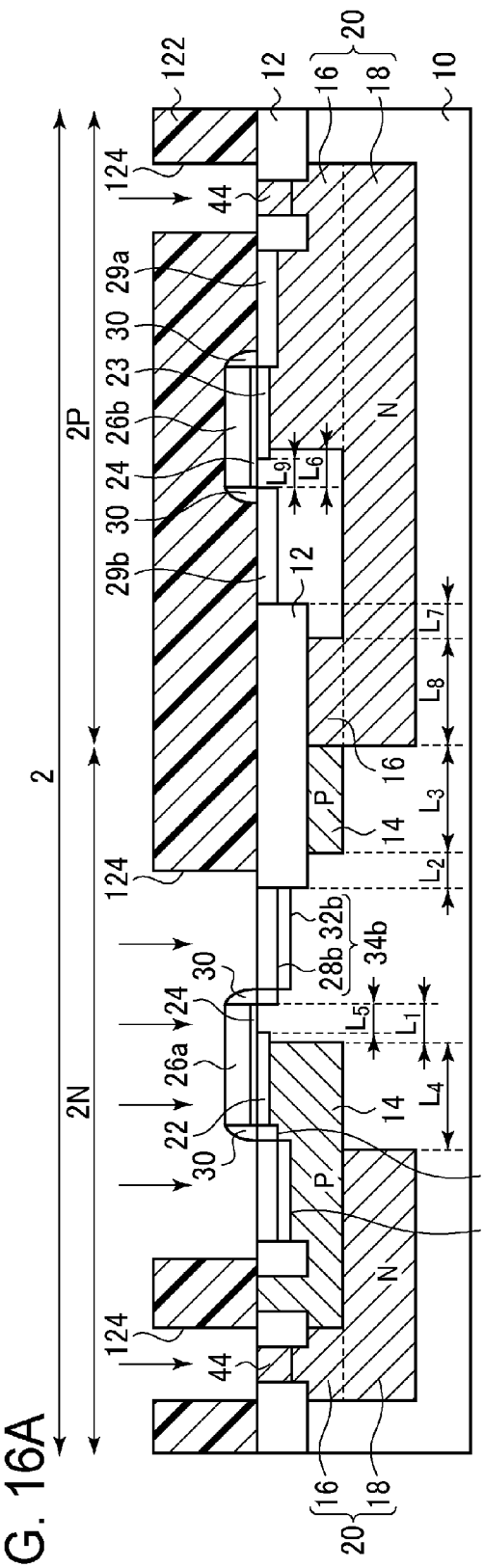
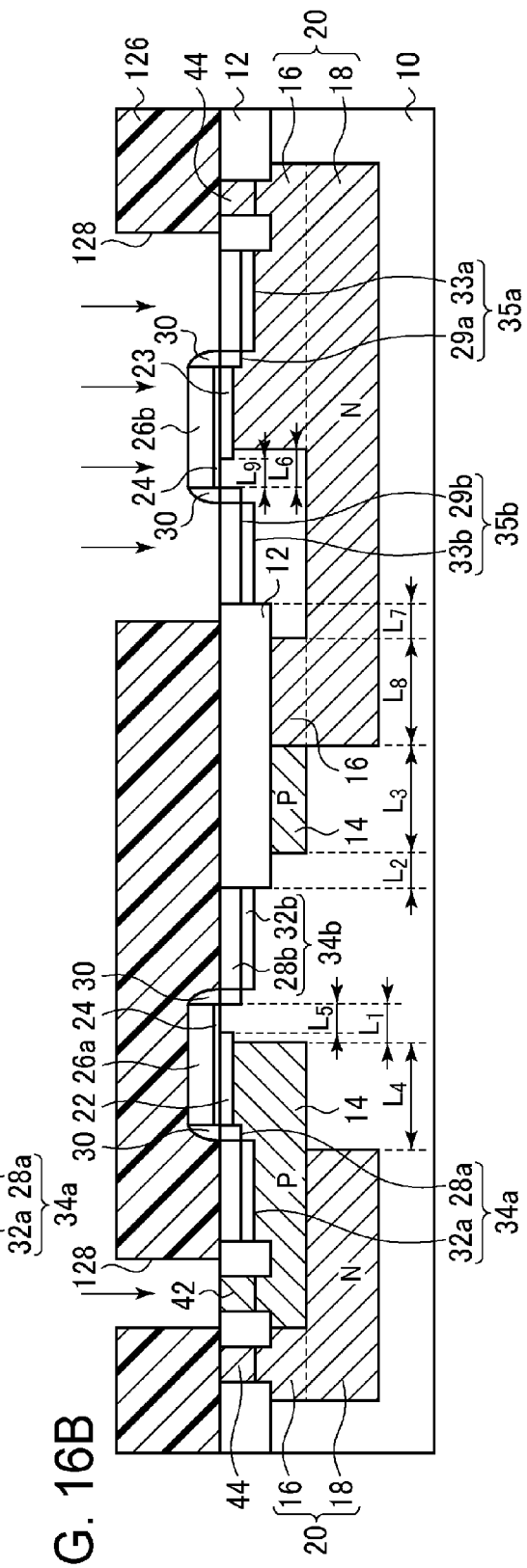
FIG. 16A
FIG. 16B

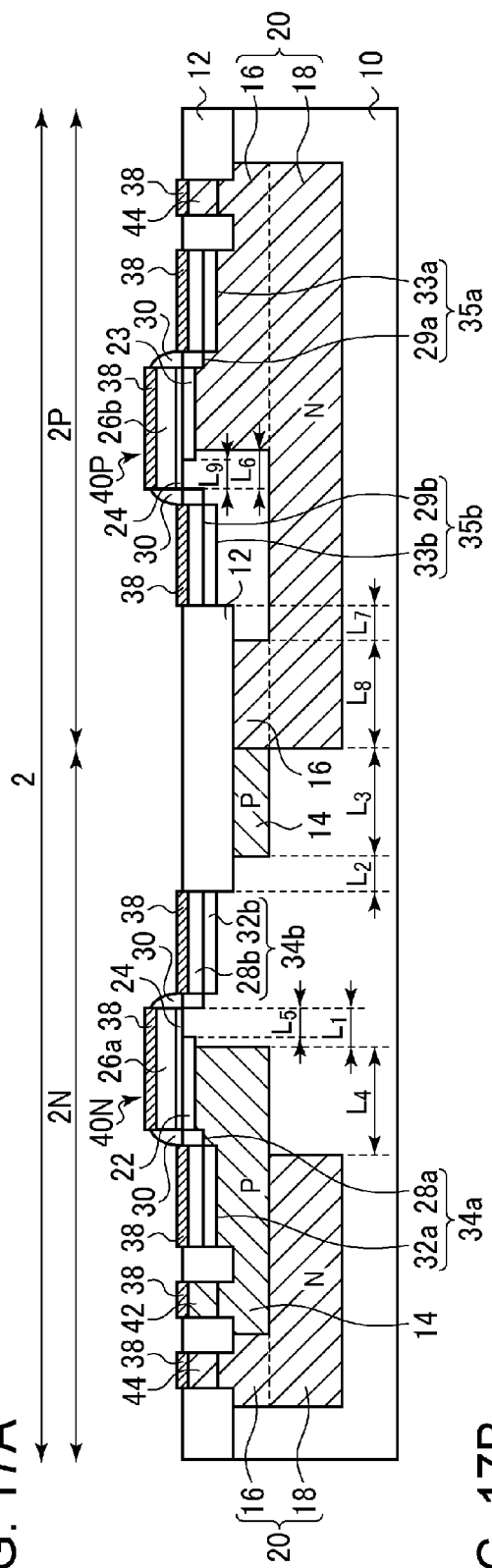
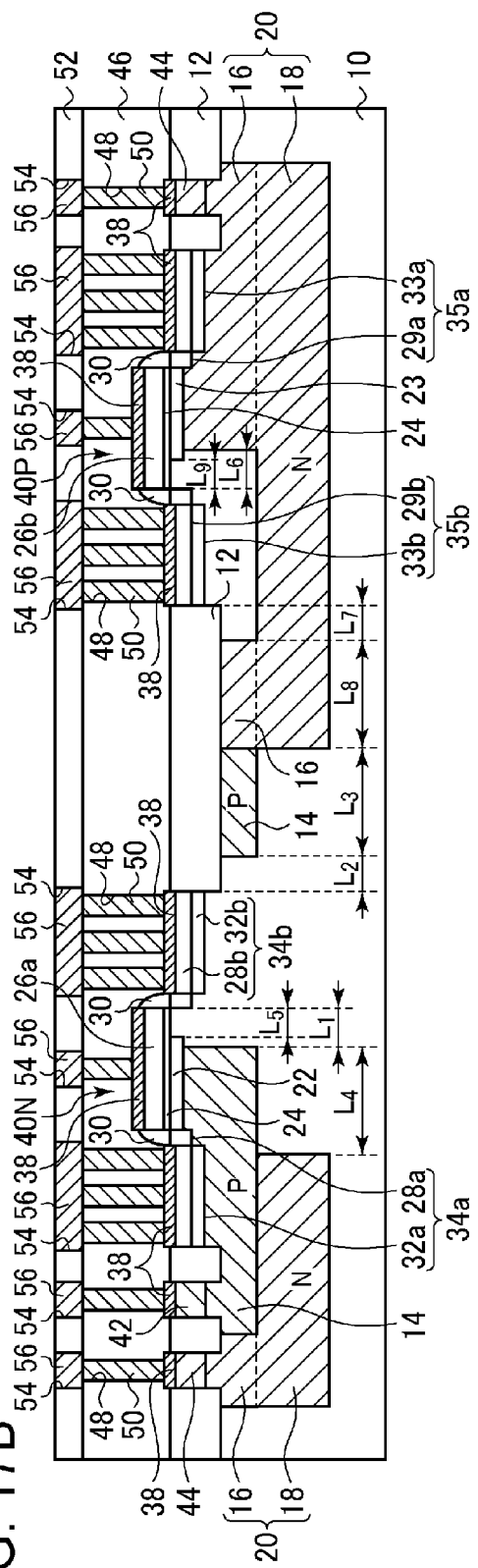

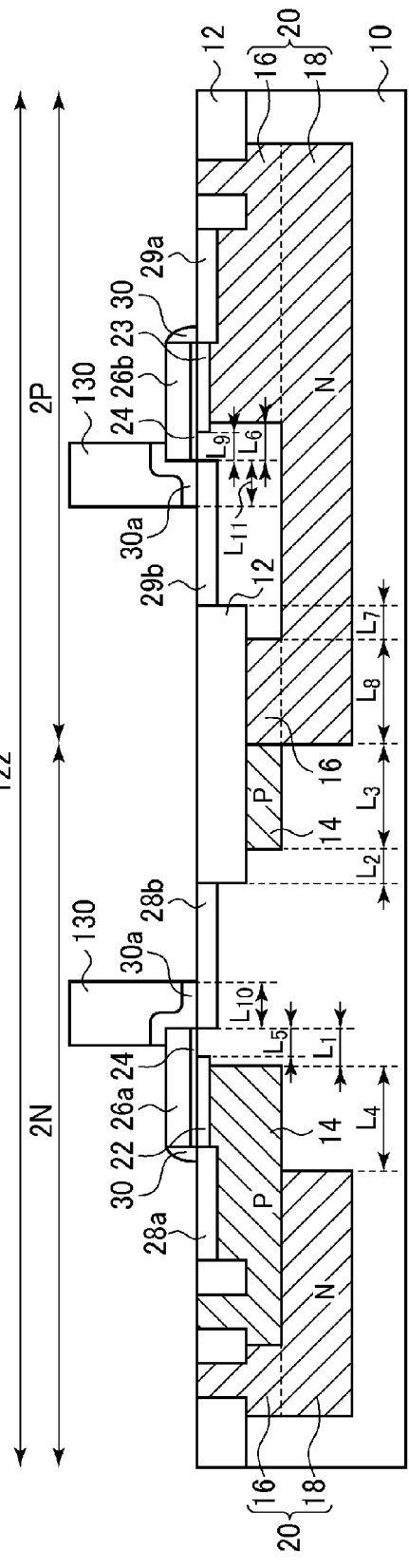
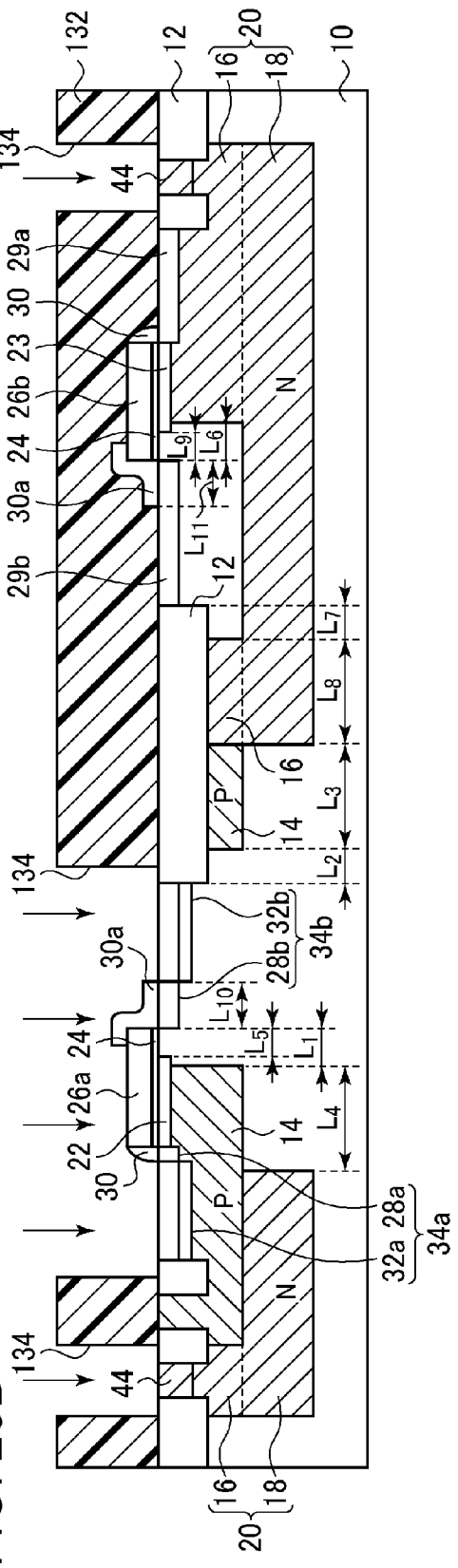
FIG. 23A
FIG. 23B

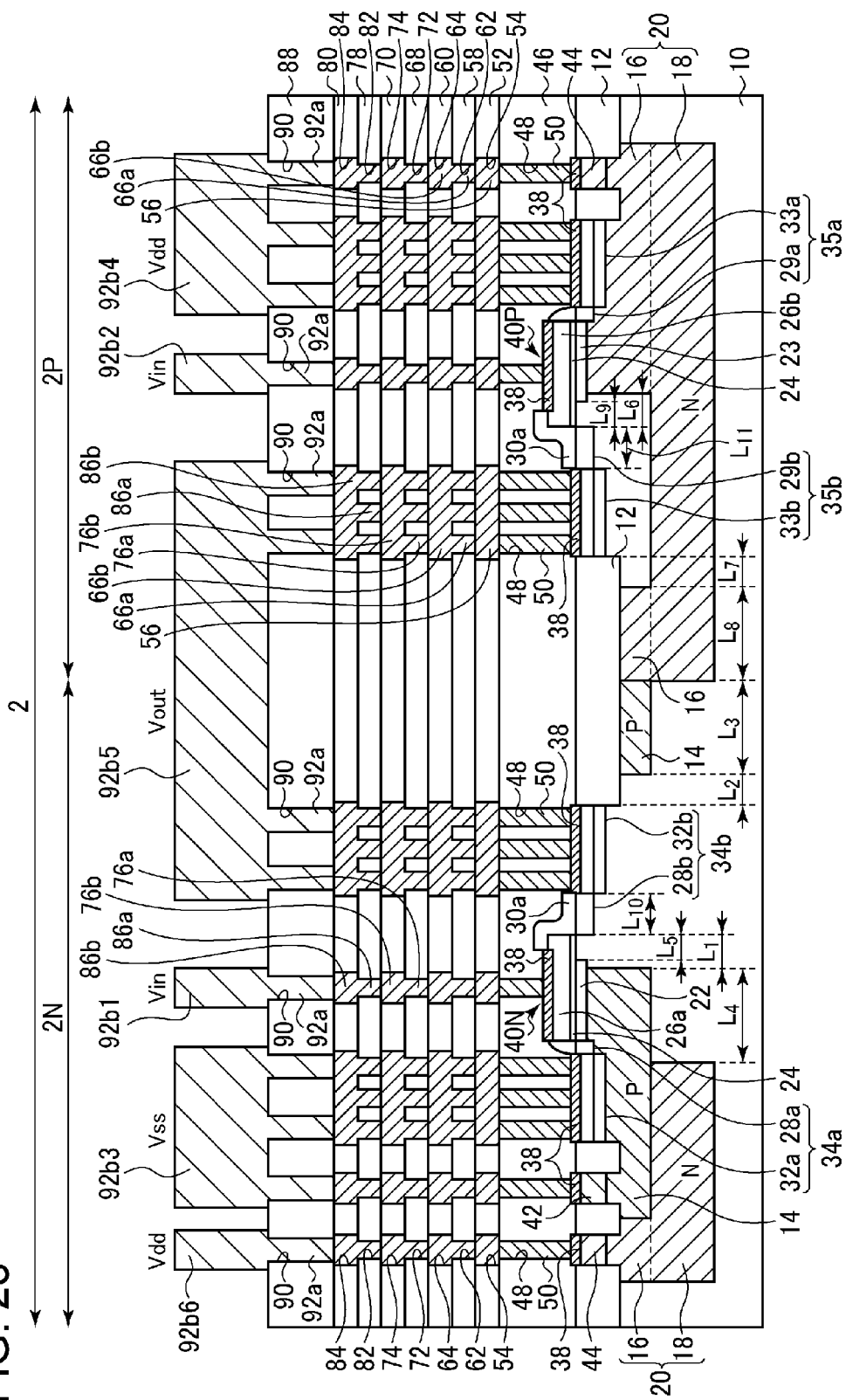

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority of the prior Japanese Patent Application No. 2012-7286, filed on Jan. 17, 2012, the entire contents of which are incorporated herein by reference.

FIELD

The embodiments discussed herein are related to a semiconductor device and a method for manufacturing a semiconductor device.

BACKGROUND

Recently, portable telephones and terminal devices, etc. of wireless communication, etc. are required to be further integrated and downsized, and to lower costs.

For this, a semiconductor device having a core unit, an input/output circuit and a high withstand voltage circuit mounted on one and the same semiconductor substrate is noted.

Transistors of the core unit and the input/output circuit unit can be formed by a general CMOS process.

On the other hand, it is preferable that the transistors used in the high withstand voltage circuit ensures high withstand voltage.

Related references are as follows:
Japanese Laid-open Patent Publication No. 2007-49039;
Japanese Laid-open Patent Publication No. Hei 7-161987; and
Japanese Laid-open Patent Publication No. 2011-199153.

SUMMARY

According to an aspect of embodiments, a semiconductor device including a first gate electrode formed over a first region of a semiconductor substrate of a first conduction type, where a first transistor is to be formed, with a first gate insulation film formed therebetween; a first source region of the first conduction type formed in the semiconductor substrate on one side of the first gate electrode; a first drain region of the first conduction type formed in the semiconductor substrate on the other side of the first gate electrode; a first channel dope layer of a second conduction type formed in at least a region on a side of the first source region of a first channel region between the first source region and the first drain region, the first channel dope layer having, at a part of the first channel dope layer on a side of the first drain region, a concentration gradient of a concentration of a dopant impurity of the second conduction type, which decrease toward the first drain region; a first well of the second conduction type formed in a region of the first region except a region where the first drain region is to be formed, the first well having, at a part of the first well on a side of the first drain region, a concentration gradient of a concentration of a dopant impurity of the second conduction type, which decrease toward the first drain region; and a second well of the second conduction type formed in the first region, connected to the first well and positioned below the first well.

According to another aspect of embodiments, a method for manufacturing a semiconductor device including: forming a first channel dope layer of a second conduction type in a first region of a semiconductor substrate of a first conduction type, where a first transistor is to be formed, the first channel dope layer being formed in a region except a first prescribed region where a dopant impurity for forming a first drain region of the first transistor is to be implanted so that the first channel dope layer is spaced from the first prescribed region; forming a first well of the second conduction type in a region of the first region except the first prescribed region so that the first well is spaced from the first prescribed region; forming a second well of the second conduction type to be connected to the first well in the first region so that the second well is positioned below the first well; forming a first gate electrode of the first transistor over the semiconductor substrate in the first region with a first gate insulation film formed therebetween; and forming a first source region of the first conduction type of the first transistor in the semiconductor substrate on one side of the first gate electrode, and forming the first drain region of the first conduction type in the first prescribed region of the semiconductor substrate on the other side of the first gate electrode.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 11A to 19 are sectional views of the semiconductor device in the steps of the method for manufacturing the semiconductor device, which illustrate the method;

FIGS. 23A to 25 are sectional views of the semiconductor device according to the second embodiment in the steps of the method for manufacturing the semiconductor device, which illustrate the method.

DESCRIPTION OF EMBODIMENTS

In a case that transistors whose withstand voltages are largely different from each other are mounted on one and the same semiconductor substrate, the increase in the number of processes may be caused.

A method for manufacturing a semiconductor device according to Reference will be described with reference to FIGS. 26A to 29C. FIGS. 26A to 29C are sectional views of the semiconductor device according to Reference in the steps of the method for manufacturing the semiconductor device, which illustrate the method.

FIGS. 26A to 29C illustrate a region where a high withstand voltage transistor is to be formed (a high withstand voltage transistor-to-be-formed region) 202.

On a semiconductor substrate 210, other than high withstand voltage transistor 240, transistor of the core unit, transistor of the input/output circuit, etc. are also formed but are not illustrated here.

Figure 26A:
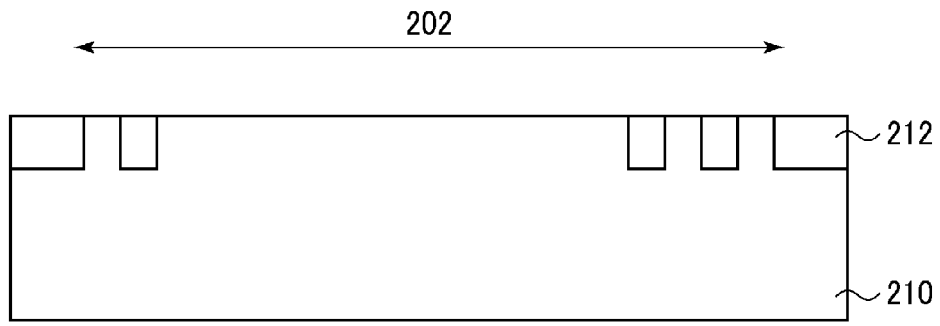
FIGS. 26A to 29C are sectional views of a semiconductor device according to Reference in the steps of the method for manufacturing the semiconductor device, which illustrate the method.

First, as illustrated in FIG. 26A, a device isolation region 212 defining a device region is formed by, e.g., STI (Shallow Trench Isolation).

Figure 26B:
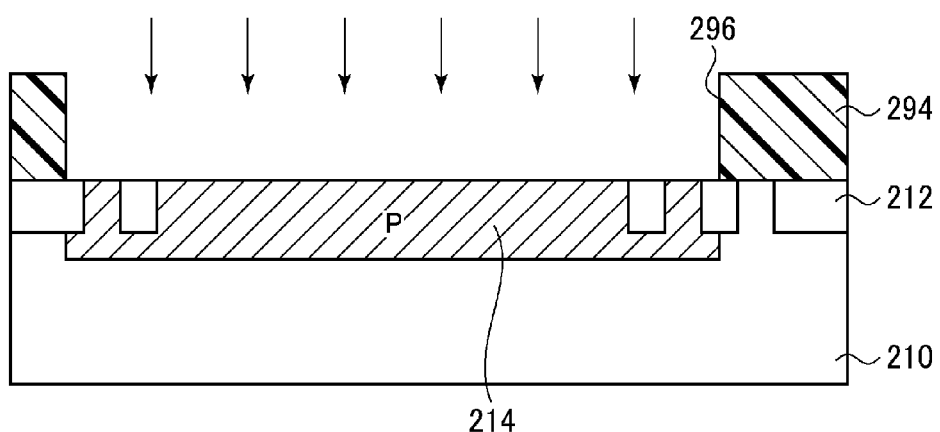

Next, as illustrated in FIG. 26B, with a photoresist film 294 with an opening 296 formed in as a mask, a P-type dopant impurity is implanted into the semiconductor substrate 210 by ion implantation to form a P-type well 214. Then, the photoresist film 294 is released by ashing.

Figure 26C:
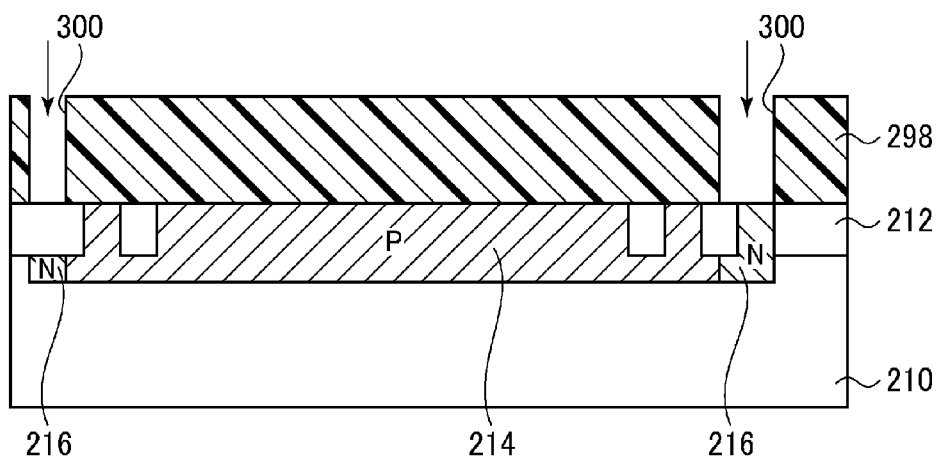

Next, as illustrated in FIG. 26C, with a photoresist film 298 with openings 300 formed in as a mask, an N-type dopant impurity is implanted into the semiconductor substrate 210 by ion implantation to form an N-type diffused layer 216. Thus, the N-type diffused layer 216 is formed, enclosing the side of the P-type well 214. Then, the photoresist film 298 is released by ashing.

Figure 27A:
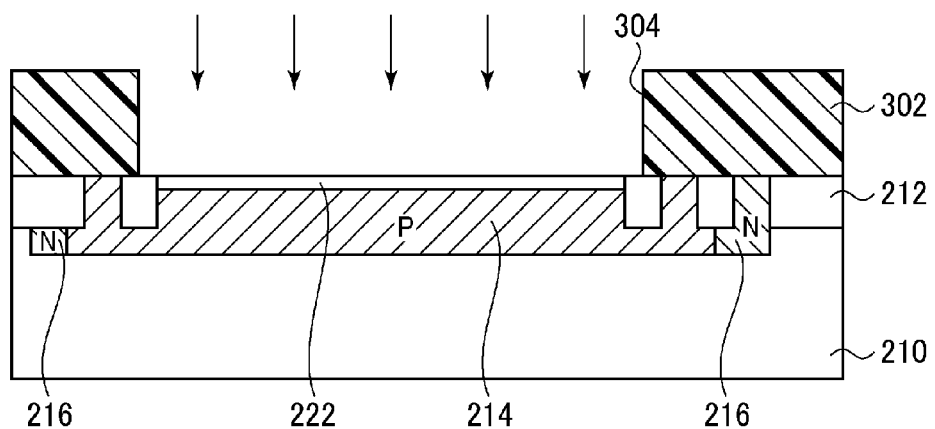
Figure 27B:
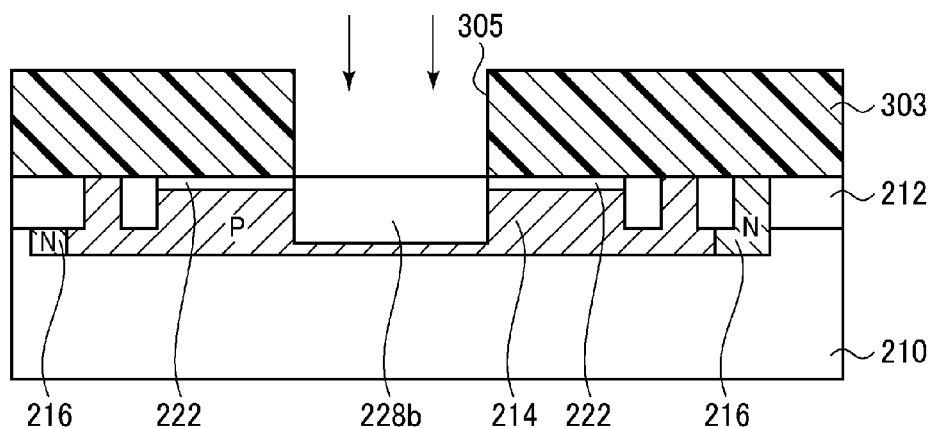

Then, as illustrated in FIG. 27A, with the photoresist film 302 with an opening 304 as the mask, a P-type dopant impurity is implanted into the semiconductor substrate 210 by ion implantation to form a channel dope layer 222. Then, the photoresist film 302 is released by ashing.

Next, a photoresist film 303 is formed on the entire surface by, e.g., spin coating.

Next, by photolithography, the photoresist film 303 is patterned. Thus, an opening 305 for forming a lightly doped drain region 228b of the high withstand voltage transistor 240 is formed in the photoresist film 303 (see FIG. 27B).

Then, by, e.g., ion implantation with the photoresist film 303 as the mask, an N-type dopant impurity is implanted into the semiconductor substrate 210 to form an N-type lightly doped region 228b. In forming the lightly doped drain region 228b, the lightly doped drain region 228b is so formed that the distance between the end of the lightly doped region 228b and the end of a heavily doped drain region 232b (see FIG. 29A) to be described later can be sufficiently large. The distance between the end of the lightly doped drain region 228b and the end of the heavily doped drain region 232b is set sufficiently large so that the impurity profile on the side of the drain 234b of the high withstand voltage transistor 240 can be mitigated. Thus, the concentration of the electric fields upon an application of a high voltage to the drain 234b can be mitigated, which leads to the improvement of the withstand voltage of the high withstand voltage transistor 240.

Figure 27C:
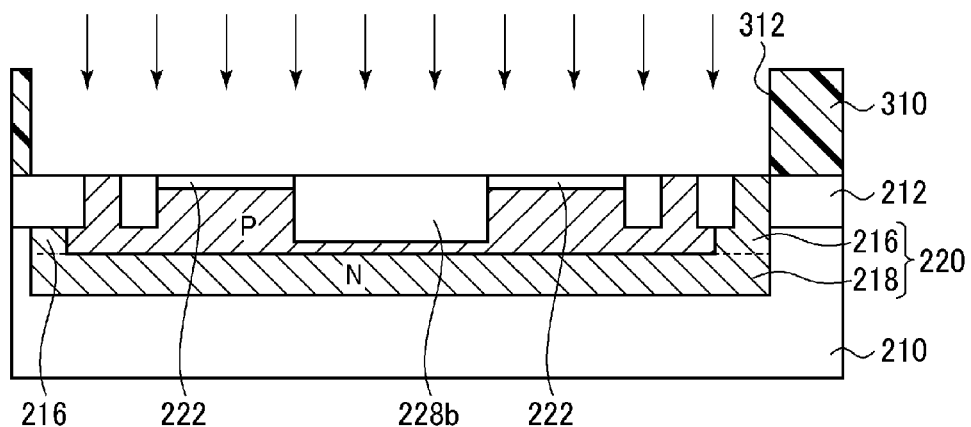

Next, as illustrated in FIG. 27C, with a photoresist film 310 with an opening 312 formed in as a mask, an N-type dopant impurity is implanted into the semiconductor substrate 210 by ion implantation to form an N-type buried diffused layer 218. The N-type buried diffused layer 218 and the N-type diffused layer 216 are connected to each other. The N-type diffused layer 216 and the N-type buried diffused layer 218 form an N-type well 220. Then, the photoresist film 310 is released by ashing.

Then, a gate insulation film 224 is formed on the surface of the semiconductor substrate 210 by thermal oxidation.

Next, a polysilicon film is formed by CVD (Chemical Vapor Deposition).

Figure 28A:
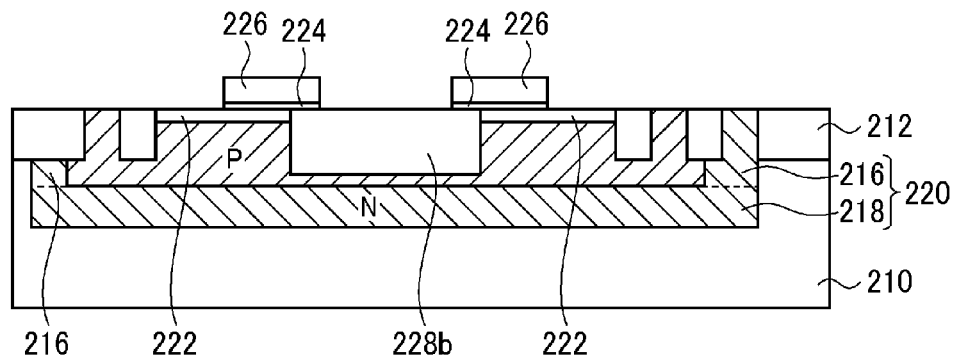

Next, the polysilicon film is patterned by photolithography to form gate electrodes 226 of polysilicon (see FIG. 28A).

Figure 28B:
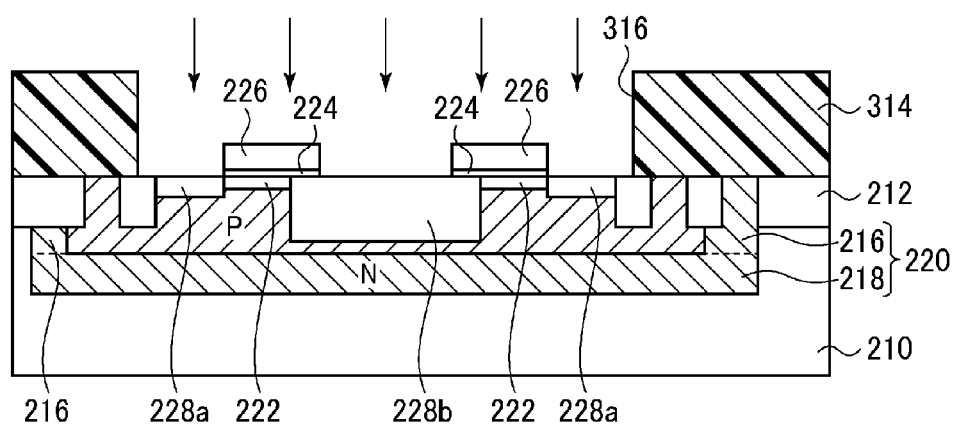

Next, as illustrated in FIG. 28B, with the photoresist film 314 with an opening 316 formed in as the mask, a dopant impurity is implanted into the semiconductor substrate 210 by ion implantation to form an N-type lightly doped diffused layer 228a. Then, the photoresist film 314 is released by ashing.

Then, an insulation film is formed on the entire surface by CVD.

Figure 28C:
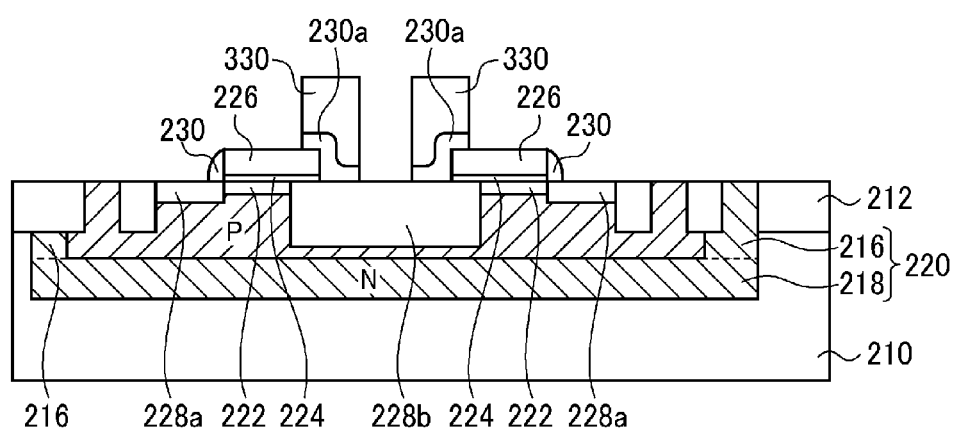

Next, as illustrated in FIG. 28C, the insulation film is etched by using as the mask a photoresist film 330 patterned in the shape of spacers 230a. Thus, the sidewall insulation film 230 is formed on the side walls of the gate electrodes 226 on the side of the lightly doped source regions 228a is formed. On the parts containing the side walls of the gate electrodes 226 on the side of the lightly doped drain regions 228b, the spacers 230a are formed. Then, the photoresist film 330 is released by ashing.

Figure 29A:
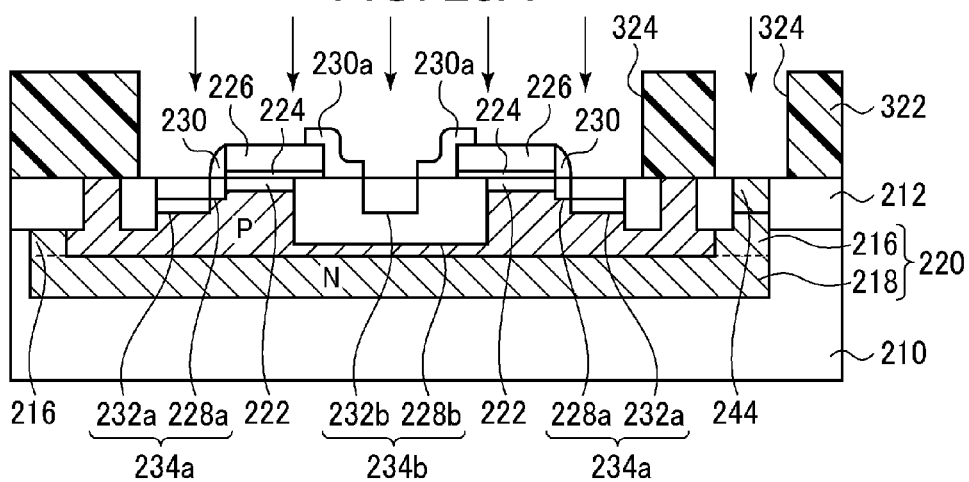

Next, as illustrated in FIG. 29A, by ion implantation with a photoresist film 322 with openings 324 formed in as a mask, a dopant impurity is implanted to form N-type heavily doped diffused layers 232a, 232b and an N-type contact region 244. The lightly doped diffused layers 228a, 228b and the heavily doped diffused layers 232a, 232b form source/drain diffused layers 234a, 234b of the extension source/drain structure or LDD (Lightly Doped Drain) structure. Then the photoresist film 322 is released by ashing.

Figure 29B:
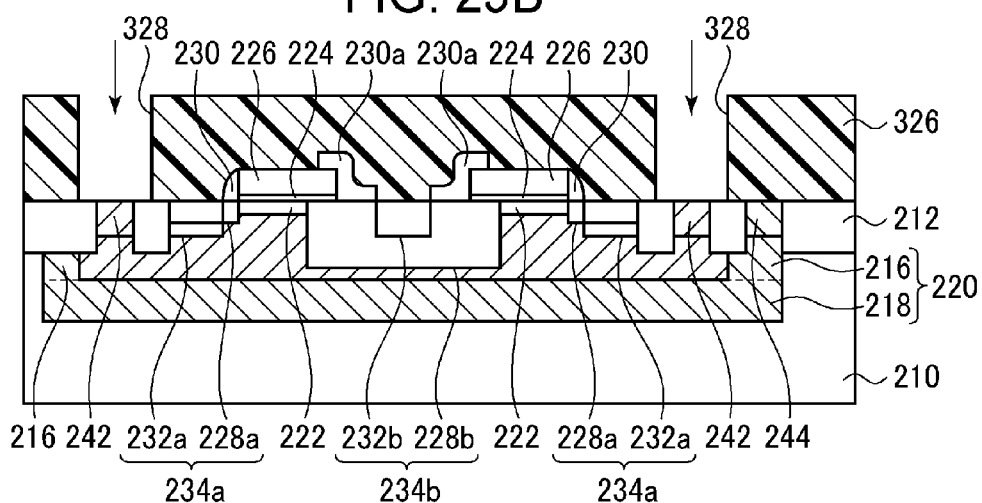

Then, as illustrated in FIG. 29B, by ion implantation with a photoresist film 326 with openings 328 formed in as a mask, a dopant impurity is implanted into the semiconductor substrate 210 to form P-type contact regions 242. Then, the photoresist film 326 is released by ashing.

Next, anneal is made to activate the dopant impurities implanted into semiconductor substrate 210.

A silicide film 238 is formed on the source/drain diffused layers 234a, 234b, the gate electrodes 226 and the contact regions 242, 244.

Figure 29C:
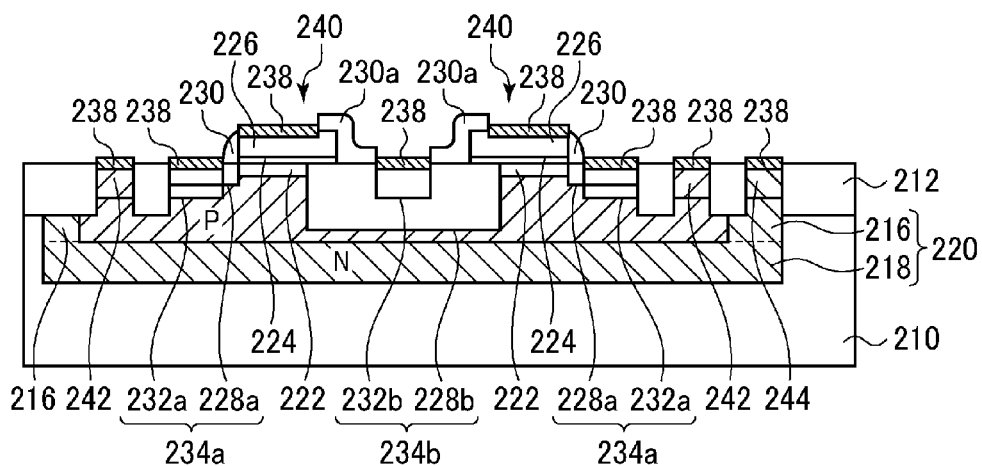

Thus, the N-channel type high withstand voltage transistor 240 including the gate electrode 226, the source/drain diffused layers 234a, 234b are formed (see FIG. 29C).

As described above, in the method for manufacturing the semiconductor device according to Reference, the lightly doped drain region 228b of the high withstand voltage transistor 240 is formed by a process different from a process of forming the lightly doped drain regions 228a. (see FIGS. 27B and 28B). The lightly doped drain region 228b and the lightly doped drain regions 228a are formed by the different processes, because the distance between the ends of the heavily doped drain region 232b and the ends of the lightly doped drain regions 228b is made sufficient to thereby sufficiently mitigate the impurity profile. Thus, the electric filed to be applied to the drain 234b upon an application of a high voltage is mitigated, and the transistor 240 can be of high withstand voltage.

However, in the method for manufacturing a semiconductor device according to Reference, the process of forming the lightly doped drain region 228b is made independently of the process of forming the lightly doped drain regions 228a, which increases the manufacturing processes. The increase of the manufacturing processes is a barrier to lowering costs of semiconductor devices.

It is often preferable to form not an N-channel type high withstand voltage transistor but a P-channel type high withstand voltage transistor.

It is also often preferable to form both of the N-channel type high withstand voltage transistor and the P-channel type high withstand voltage transistor.

The inventors of the present application made earnest studies and has got the idea of a semiconductor device and a method for manufacturing the same to be described below.

[a] First Embodiment

The semiconductor device according to a first embodiment and its manufacturing method will be describe with reference to FIGS. 1 to 19.

Semiconductor Device

Figure 1:
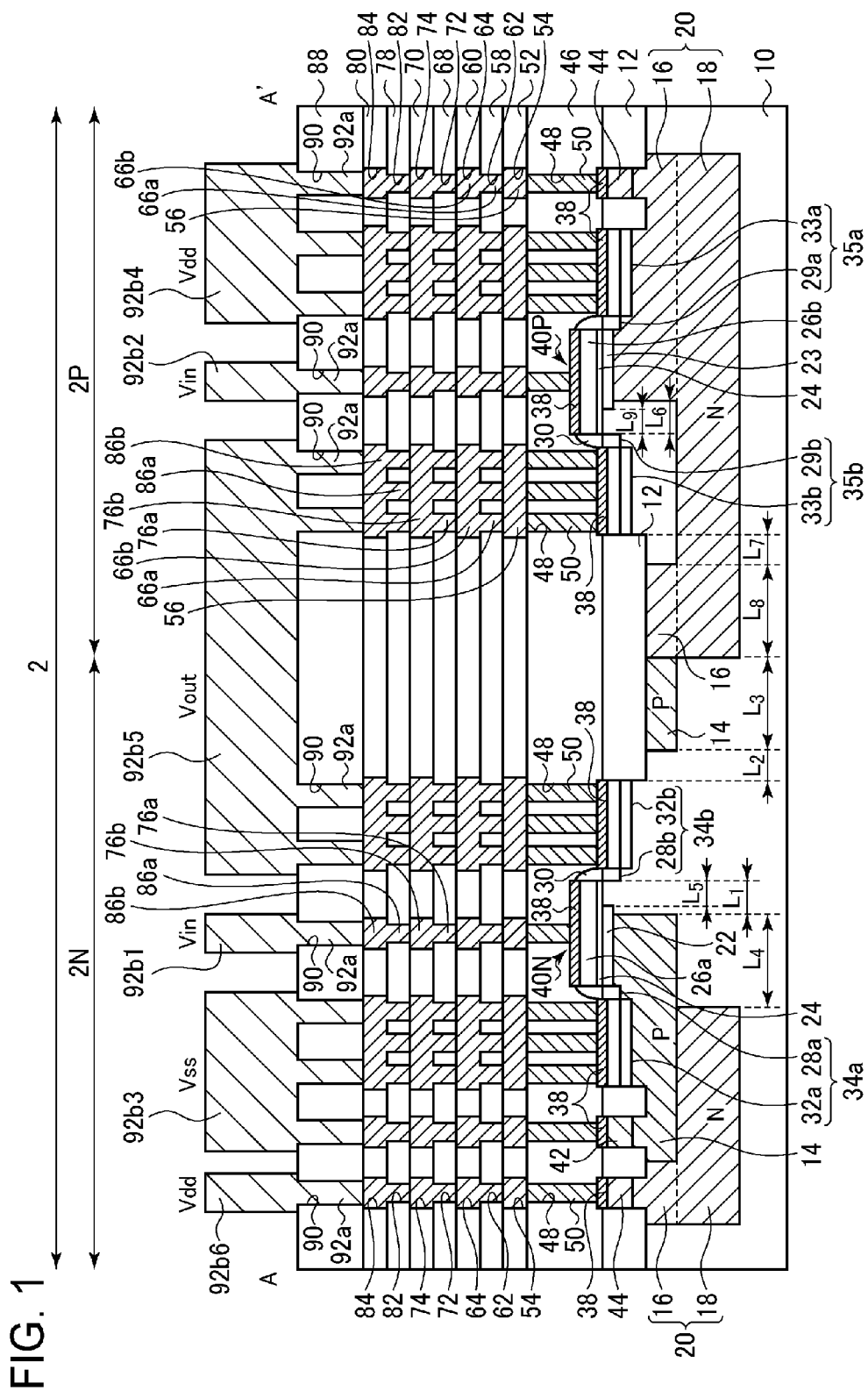
FIG. 1 is a sectional view of a semiconductor device according to a first embodiment (Part 1)
Figure 2A:
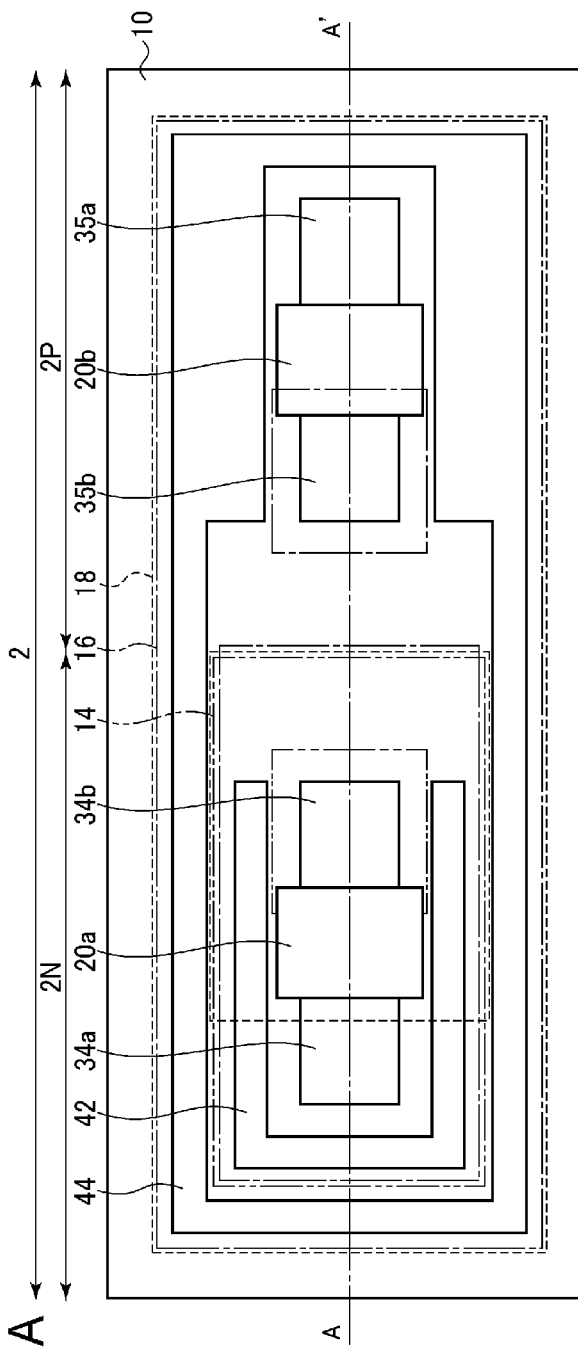
FIG. 2A is a plan view of the semiconductor device according to the first embodiment.
Figure 2B:
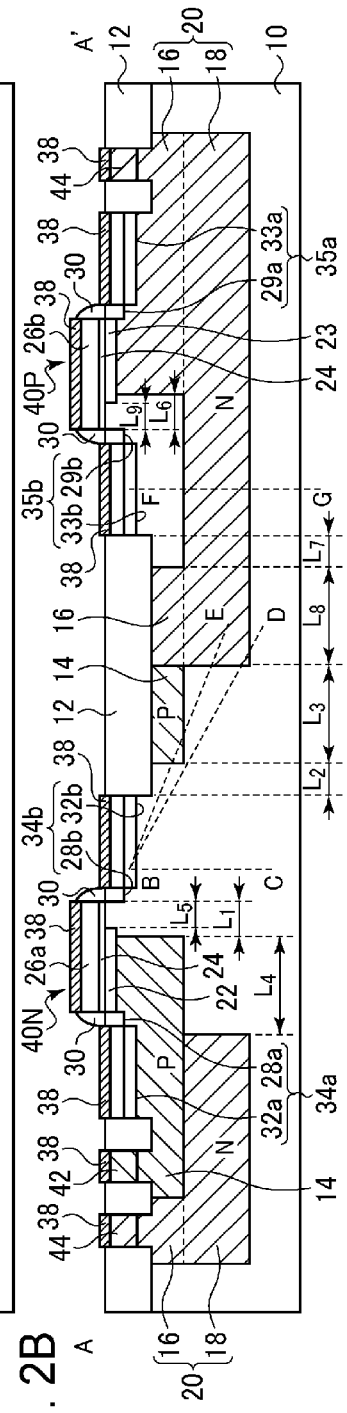
FIG. 2B is a sectional view of the semiconductor device according to the first embodiment (Part 2)

First, the semiconductor device according to the present embodiment will be described with reference to FIGS. 1 to 10. FIG. 1 is a sectional view of the semiconductor device according to the present embodiment. FIGS. 2A and 2B are a plan view and a sectional view of the semiconductor device according to the present embodiment. FIG. 2A is the plan view, and the FIG. 2B is the sectional view. FIGS. 1 and 2B are the A-A' line sectional view of FIG. 2A. FIGS. 1 to 2B illustrate a region where a high withstand voltage transistors is to be formed (a high withstand voltage transistors-to-be-formed region) 2. The left sides of the drawings of FIGS. 1 to 2B are a region where an N-channel type high withstand voltage transistor is be formed (an N-channel type high withstand voltage transistor-to-be-formed region) 2N. The right sides of the drawing of FIGS. 1 to 2B illustrate a region where a P-channel type high withstand voltage transistor is formed (a P-channel type high withstand voltage transistor-to-be-formed region) 2P. In regions other than the high withstand voltage transistor-to-be-formed region 2, there is a case that low withstand voltage transistors of a core unit and an input/output circuit are formed, but they are not be described here.

As illustrated in FIGS. 1 to 2B, device isolation regions 12 defining device regions are formed in a semiconductor substrate 10. The semiconductor substrate 10 is, e.g., a P-silicon substrate.

In the semiconductor substrate 10 in the N-channel type high withstand voltage transistor-to-beformed-region 2N, a P-type well 14, for example, is formed. In a region other than the region where a lightly doped drain region 28b is to be formed, the P-type well 14 is formed, enclosing the region where the lightly doped drain region 28b is to be formed, and being spaced from the lightly doped drain region 28b. That is, in a region spaced from the region in which a dopant impurity forming the lightly doped drain region 28b is to be implanted, a dopant impurity forming the P-type well 14 is implanted. In other words, in the design data and on the reticle, the region where the lightly doped drain region 28b is to be formed and the region where the P-type well 14 is to be formed are spaced from each other.

The distance $L_1$ (see FIG. 2B) between the end of the region where the lightly doped drain region 28b is to be formed, on the side of the gate electrode 26a, and the P-type well 14 is, e.g., about 100-300 nm. The distance $L_1$ between the end of the region where the lightly doped drain region 28b is to be formed, on the side of the gate electrode 26a, and the P-type well 14 is, e.g., about 220 nm here. The distance $L_2$ (see FIG. 2B) between the edge (the end) of the device isolation region 12 contacting the drain diffused region 34b and the edge of the P-type well 14 on the side of the drain diffused layer 34b is, e.g., about 100-600 nm. The P-type well 14 is formed, spaced from the region where the lightly doped drain region 28b is to be formed so that blunt impurity profiles can be obtained between the lightly dope drain region 28b and the P-type well 14. Thus, even when a high voltage is applied to the drain 34b of the N-channel type high withstand voltage transistor 40N, the concentration of the electric filed of the N-channel type high withstand voltage transistor 40N on the side of the drain 34b can be sufficiently mitigated, and the withstand voltage can be sufficient.

Near the border between the N-channel type high withstand voltage transistor-to-be-formed region 2N and the P-channel type high withstand voltage transistor-to-be-formed region 2P, the distance $L_3$ between the edge of the P-type well 14 on the side of the drain 34b and the edge of the N-type well 18 on the side of the drain 34b is, e.g., about 1-1.5 µm. The distance $L_3$ between the edge of the P-type well 14 on the side of the drain 34b and the edge of the N-type well 18 on the side of the drain 34b is set so large to thereby prevent the electrically connecting between the drain 34b and the N-type well 18 due to the thermal diffusion of the dopant impurity.

After dopant impurities forming the P-type well and the lightly doped drain region 28b have been implanted, heat processing for activating the dopant impurities is made. The P-type dopant impurity implanted to form the P-type well 14 is diffused by this heat processing. The N-type dopant impurity implanted to form the lightly doped drain region 28b is also diffused. Accordingly, in the portion of the P-type well 14 on the side of the lightly doped drain region 28b, a concentration gradient of the P-type dopant impurity, which decreases from the P-type well 14 to the lightly doped drain region 28b is present. In the lightly doped drain region 28b, a concentration gradient of the N-type dopant impurity, which decreases from the lightly doped drain region 28b to the P-type well 14 is present. Such diffusion of the dopant impurity might not space the P-type well 14 and the lightly doped drain region 28b from each other. However, with the dopant impurity diffused by such heat processing, blunt impurity profiles are still obtained between the lightly doped drain region 28b and the P-type well 14. Even with the P-type well 14 and the lightly doped drain region 28b not spaced from each other due to the dopant impurity diffusion, the concentration of the electric fields between the lightly doped drain region 28b and the P-type well 14 is sufficiently mitigated, and the withstand voltage can be sufficient. Thus, the P-type well 14 and the lightly doped drain region 28b may not be spaced from each other, and the concentration gradient of the N-type dopant impurity, which decreases from the lightly doped drain region 28b to the P-type well 14 may be present.

In the semiconductor substrate 10 in the high withstand voltage transistor-to-be-formed region 2, an N-type diffused layer 16 is formed, enclosing the side (the outer edge) of the P-type well 14.

In the semiconductor substrate 10 in the high withstand voltage transistor-to-be-formed region 2, an N-type buried diffused layer (Deep-N-type well) 18 is formed in a region deeper than the P-type well 14. The N-type diffused layer 16 and the N-type buried diffused layer 18 are connected to each other. The N-type diffused layer 16 and the N-type buried diffused layer 18 form an N-type well 20.

The edge of the N-type buried diffused layer 18 on the side of the drain diffused layer 34b is sufficiently spaced from the edge of the P-type well 14 on the side of the drain diffused layer 34b. The distance $L_4$ (see FIG. 2B) between the edge of the N-type buried diffused layer 18 on the side of the drain diffused layer 34b and the edge of the P-type well 14 on the side of the drain diffused layer 34b is, e.g., about 1-1.5 μm. The distance $L_4$ between the edge of the N-type buried diffused layer 18 on the side of the drain diffused layer 34b and the edge of the P-type well 14 on the side of the drain diffused layer 34b is, e.g., about 1 μm here. The distance $L_4$ between the edge of the N-type buried diffused layer 18 on the side of the drain diffused layer 34b and the edge of the P-type well 14 on the side of the drain diffused layer 34b is set so sufficiently large so as to prevent the electrically connecting between the buried diffused layer 18 and the drain diffused layer 34b due to the thermal diffusion of the dopant impurity. The distance $(L_1+L_4)$ between the region where the lightly doped drain region 28b is to be formed, and the N-type buried diffused layer 18 is larger than the distance $L_1$ between the region where the lightly doped drain region 28b is to be formed and the P-type well 14c.

In the semiconductor substrate 10 in the N-channel type high withstand voltage transistor-to-be-formed region 2N, a channel dope layer is formed. In the N-channel type high withstand voltage transistor-to-be-formed region 2N, the channel dope layer 22 is formed, spaced from the region where the lightly doped drain region 28b is to be formed, in the region except the region where the lightly doped drain region 28b is to be formed. That is, the region spaced from the region where the dopant impurity forming the lightly doped drain region 28b is to be implanted, a dopant impurity forming the channel dope layer 22 is implanted. In other words, in the design data and on the reticle the region where the lightly doped drain region 28b is to be formed and the region where the channel dope layer 22 is to be formed are spaced from each other. The channel dope layer 22 is formed in that of the channel region between the source region 34a and the drain region 34b, which is at least on the side of the source region 34a. The distance $L_5$ between the region where the lightly doped drain region 28b is to be formed and the channel dope layer 22 is about, e.g., 100-300 nm. The distance $L_5$ between the region where the lightly doped drain region 28b is to be formed and the channel dope layer 22 is, e.g., about 180 nm.

The channel dope layer 22 is formed, spaced from the lightly doped drain region 28b so that blunt impurity profiles between the lightly doped drain region 28b and the channel dope layer 22 can be obtained. Thus, even when a high voltage is applied to the drain diffused layer 34b of the N-channel type high voltage transistor 40N, the concentration of the electric fields between the lightly doped drain region 28b and the channel dope layer can be sufficiently mitigated, and the withstand voltage can be sufficient.

After the channel dope layer 22 and the lightly doped drain region 28b have been formed, heat processing for activating the dopant impurities is made. This heat processing diffuses the P-type dopant impurity implanted for forming the channel dope layer 22. This heat processing also diffuses the N-type dopant impurity implanted for forming the lightly doped drain region 28b. In the portion of the channel dope layer 22 on the side of the lightly doped drain region 28b, a concentration gradient of the concentration of the P-type dopant impurity declining from the channel dope layer 22 to the lightly doped drain region 28b is present. A concentration gradient of the concentration of the N-type dopant impurity declining from the lightly doped drain region 28b to the channel dope layer 22 is also present. Such diffusion of the dopant impurities might not space the channel dope layer 22 and the lightly doped drain region 28b from each other. However, even with the dopant impurities diffused by such heat processing, the blunt impurity profiles are still present between the lightly doped drain region 28b and the channel dope layer 22. Thus, even when a high voltage is applied to the drain diffused layer 34b of the N-channel type high withstand voltage transistor 40N, the concentration of the electric fields can be sufficiently mitigated between the lightly doped drain region 28b and the channel doped payer 22, and the withstand voltage can be made sufficient. Accordingly, the channel dope layer 22 and the lightly doped drain region 28b may not be spaced from each other, and the concentration gradient of the concentration of the P-type dopant impurity, which decreases from the channel dope layer 22 to the lightly doped drain region 28b may be present.

On the semiconductor substrate 10 in the N-channel type high withstand voltage transistor-to-be-formed region 2N, a gate electrode 26a is formed with the gate insulation film 24 formed therebetween. As the material of the gate electrode 26a, polysilicon, for example, is used.

In the semiconductor substrate 10 on both sides of the gate electrode 26a, N-type lightly doped diffused layers (the extension regions) 28a, 28b are formed.

On the side wall of the gate electrode 26a, a sidewall insulation film (a spacer) 30 is formed.

In the semiconductor substrate 10 on both sides of the gate electrode 26a with the sidewall insulation film 30 formed on, N-type heavily doped diffused layers 32a, 32b are formed. The N-type lightly doped diffused layers 28a, 28b and the N-type heavily doped diffused layers 32a, 32b form the source/drain diffused layers 34a, 34b of the extension source/drain structure or the LDD structure.

Thus, the N-channel type high withstand voltage transistor 40N including the gate electrode 26a and the source/drain diffused layers 34a, 34b is formed.

In the N-channel type high withstand voltage transistor-to-be-formed region 2N, a P-type contact region 42 electrically connected to the P-type well 14 is formed.

In the semiconductor substrate 10 in the P-channel type high withstand voltage transistor-to-be-formed region 2P, an N-type well 16 is formed in the region except the region where the lightly doped drain region 29b is to be formed, enclosing the lightly doped drain region 29b and spaced from the lightly doped region 29b. That is, in the P-channel type high withstand voltage transistor-to-be-formed region 2P, a dopant impurity forming the N-type well 16 is implanted in the region spaced from the region in which a dopant impurity forming the lightly doped drain region 29b is to be implanted. In other words, in the design data and on the reticle, the region where the N-type well 16 of the P-channel type high withstand voltage transistor-to-be-formed region 2P, and the region where the lightly doped drain region 29b is to be formed are spaced from each other.

The above-described N-type diffused layer 16 formed, enclosing the side of the P-type well 16, and the N-type well 16 formed in the P-channel type high withstand voltage transistor-to-be-formed region 2P are integrally formed of one and the same N-type diffused layer.

The distance $L_6$ (see FIG. 2B) between the end of the region where the lightly doped drain region 29b is to be formed on the side of the gate electrode 26b and the N-type well 16 is, e.g., about 100-300 nm. The distance $L_6$ between the end of the region where the lightly doped drain region 29b is to be formed on the side of the gate electrode 26b and the N-type well 16 is e.g., about 140 nm here. The distance $L_7$ (see FIG. 2B) between the edge of the device isolation region 12, which contacts the lightly doped drain region 29b and the edge of the N-type well 16 on the side of the lightly doped drain region 29b is, e.g., about 100-600 nm. The width $L_8$ (see FIG. 2B) of the N-type well 16 near the border between the N-channel type high withstand voltage transistor-to-be-formed region 2N and the P-channel type high withstand voltage transistor-to-be-formed region 2P is, e.g., about 1-1.5 μm.

The N-type well 16 of the P-channel type high withstand voltage transistor-to-be-formed region 2P is formed, spaced from the region where the lightly doped drain region 29b is formed so that blunt impurity profiles can be obtained between the lightly doped drain region 29b and the N-type well 16. Thus, even when a high voltage is applied to the drain 35b of the P-channel type high withstand voltage transistor 40P, the concentration of an electric filed of the transistor 40P on the side of drain 35b can be sufficiently mitigated, and the withstand voltage can be sufficient.

After the dopant impurities forming the N-type well 16 and the lightly doped drain region 29b have been implanted, heat processing for activating the dopant impurities is made. The N-type dopant impurity implanted for forming the N-type well 16 is diffused by this heat processing. The P-type dopant impurity implanted for forming the lightly doped drain region 29b is also diffused. In the part of the N-type well 16 on the side of the lightly doped drain region 29b, a concentration gradient of the concentration of the N-type dopant impurity, which decreases from the N-type well 16 to the lightly doped drain region 29b is present. The concentration gradient of the concentration of the P-type dopant impurity, which decreases from the lightly doped drain region 29b to the N-type well 16 is present. Such diffusion of the dopant impurity might not space the N-type well 16 and the lightly doped drain region 29b. However, even with the diffusion of the dopant impurity by the heat processing, the blunt impurity profile is still present between the lightly doped drain region 29b and the N-type well 16. Even with the N-type well 16 and the lightly doped drain region 29b not spaced from each other due to the diffusion of the dopant impurities, the concentration of the electric fields between the lightly doped drain region 29b and the N-type well 16 is sufficiently mitigated, and the withstand voltage can be sufficient. Thus, the N-type well 16 and the lightly doped drain region 29b may not be spaced from each other, and the concentration gradient of the concentration of the P-type dopant impurity, which decreases from the lightly doped drain region 29b to the N-type well 16 may be present.

In the semiconductor substrate 10 in the P-channel type high withstand voltage transistor-to-be-formed region 2P, the N-type buried diffused layer (Deep-N-type well) 18 is formed in a region deeper than the N-type well 16. The buried diffused layer 18 is formed, spaced from the lightly doped drain region 29b in the region below the region where the N-type well 16 is formed and also in the region below the lightly doped drain region 29b. The N-type well 16 and the N-type buried diffused layer 18 are connected to each other. The N-type well 16 and the N-type buried diffused layer 18 form the N-type well 20. The part of the semiconductor substrate 10 enclosed by the N-type well 16, and the drain diffused layer 35b of the P-channel type high withstand voltage transistor 40P are electrically isolated from the semiconductor substrate 10 by the N-type well 20. The drain diffused layer 35 is electrically isolated from the semiconductor substrate 10 by the N-type well 18, whereby the P-channel type high withstand voltage transistor 40P can normally operate.

In the semiconductor substrate 10 in the P-channel type high withstand voltage transistor-to-be-formed region 2P, a channel dope layer 23 is formed. In the region except the region where the lightly doped drain region 29b is to be formed, the channel dope layer 23 is formed, spaced from the region where the lightly doped drain region 29b is to be formed. That is, a dopant impurity forming the channel dope layer is implanted in the region spaced from the region where the dopant impurity forming the lightly doped drain region 29b is to be implanted. In other words, in the design data and on the reticle, the region where the lightly doped drain region 29b is to be formed and the region where the channel dope layer 23 is to be formed are spaced from each other. The channel dope layer 23 is formed in the region of the channel region between the source region 35a and the drain region 35b, which is on the side of at least the source region 35a. The distance $L_9$ (see FIG. 2B) between the region where the lightly doped drain region 29b is to be formed and the channel dope layer 23 is, e.g., about 100-300 nm. The distance $L_9$ between the region where the lightly doped region 29b is to be formed and the channel dope layer 23 is, e.g., about 140 nm.

The channel dope layer 23 is formed, spaced from the lightly doped drain region 29b so that blunt impurity profiles are obtained between the lightly doped drain region 29b and the channel dope layer 23. Thus, even when a high voltage is applied to the drain 35b of the P-channel type high withstand voltage transistor 40P, the concentration of the electric fields can be sufficiently mitigated between the lightly doped drain region 29b and the channel dope layer 23, and the withstand voltage can be made sufficient.

After the channel dope layer 23 and the lightly doped drain region 29b have been formed, heat processing for activating the dopant impurities is made. This heat processing diffuses the N-type dopant impurity implanted for forming the channel dope layer 23. This heat processing also diffuses the P-type dopant impurity implanted for forming the lightly doped drain region 29b. In the part of the channel dope layer 23 on the side of the lightly doped drain region 29b, a concentration gradient of the concentration of the N-type dopant impurity, which decreases from the channel dope layer 23 to the lightly doped drain region 29b is present. In the part of the lightly doped drain region 29b on the side of the channel dope layer 23, a concentration gradient of the concentration of the P-type dopant impurity, which decreases from the lightly doped drain region 29b to the channel dope layer 23 is present. Such diffusion of the dopant impurities might not space the channel dope layer 23 and the lightly doped drain region 29 from each other. However, even with the dopant impurities diffused by such heat processing, blunt impurity profiles can be obtained between the lightly doped drain region 29 and the channel dope layer 23. Thus, even when a high voltage is applied to the drain 35b of the P-channel type high withstand voltage transistor 40P, the concentration of the electric fields can be sufficiently mitigated between the lightly doped drain region 29b and the channel dope layer 23. Thus, the channel dope layer 23 and he lightly doped drain region 29b may not be spaced from each other, and a concentration gradient of the concentration of the N-type dopant impurity, which decreases from the channel dope layer 23 to the lightly doped drain region 29b may be present.

On the semiconductor substrate 10 in the P-channel type high withstand voltage transistor-to-be-formed region 2P, a gate electrode 26b is formed with the gate insulation film 24 formed therebetween. As the material of the gate electrode 26b, polysilicon or others, for example, is used.

In the semiconductor substrate 10 on both sides of the gate electrode 26b, P-type lightly doped diffused layers 29a, 29b are formed.

On the side wall of the gate electrode 26b, the sidewall insulation film 30 is formed.

In the semiconductor substrate 10 on both sides of the gate electrode 26b with the sidewall insulation film 30 formed on, P-type heavily doped diffused layers 33a, 33b are formed. The P-type lightly doped diffused layers 29a, 29b and the P-type heavily doped diffused layers 33a, 33b form the source/drain diffused layers 35a, 35b of the extension source/drain structure or the LDD structure.

Thus, the P-channel type high withstand voltage transistor 40P including the gate electrode 26b and the source/drain diffused layers 35a, 35b is formed.

Around the high withstand voltage transistor-to-be-formed region 2, an N-type contact region (a well tap region) 44 electrically connected to the N-type well 16 is formed. The N-type contact region is formed, enclosing the high withstand voltage transistor-to-be-formed region 2 (see FIG. 2A).

On the source/drain regions 34a, 34b, 35a, 35b, on the gate electrodes 26a, 26b and on the contact regions 42, 44, a silicide film 38 is formed. The silicide film 38 on the source/drain regions 34a, 34b, 35a, 35b functions as the source/drain electrodes.

On the semiconductor substrate 10 with the transistors 40N, 40P formed on, an inter-layer insulation film 46 of, e.g., an about 400 nm-film thickness silicon oxide film is formed. In the inter-layer insulation film 46, contact holes 48 are formed down to the silicide film 38. In the contact holes 48, conductor plugs 50 are buried. As the material of the conductor plugs 50, tungsten (W), for example, is used.

On the inter-layer insulation film 46 with the conductor plugs 50 buried in, an inter-layer insulation film 52 is formed. In the inter-layer insulation film 52, trenches 54 for interconnections 56 to be buried in are formed. In the trenches 54, interconnections 56 connected to the conductor plugs 50 are buried. As the material of the interconnections 56, copper (Cu), for example, is used.

On the inter-layer insulation film 52 with the interconnections 56 buried in, an inter-layer insulation film 58 is formed. On the inter-layer insulation film 58, an inter-layer insulation film 60 is formed. In the inter-layer insulation film 58, contact holes 62 are formed down to the interconnections 56. In the inter-layer insulation film 60, trenches 64 connected to the contact holes 62 are formed. In the contact holes 62, conductor plugs 66a are formed, and in the trenches 64, interconnection 66b are formed integral with the conductor plugs 66a. As the material of the conductor plugs 66a and the interconnection 66b, Cu, for example, is used.

On the inter-layer insulation film 60 with the interconnections 66b buried in, an inter-layer insulation film 68 is formed. On the inter-layer insulation film 68, an inter-layer insulation film 70 is formed. In the inter-layer insulation film 68, contact hole 72 reached to the interconnections 66b are formed. In the inter-layer insulation film 70, trenches 74 connected to the contact holes 72 are formed. In the contact holes 72, conductor plugs 76a are formed, and in the trenches 74, interconnections 76b are formed integral with the conductor plugs 76b. As the material of the conductor plugs 76a and the interconnections 76b, Cu, for example, is used.

On the inter-layer insulation film 70 with the interconnections 76b buried in, an inter-layer insulation film 78 is formed. On the inter-layer insulation film 78, an inter-layer insulation film 80 is formed. In the inter-layer insulation film 78, contact holes 82 are formed down to the interconnections 76b. In the inter-layer insulation film 80, trenches 84 connected to the contact holes 82 are formed. In the contact holes 82, conductor plugs 86a are formed, and in the trenches 84, interconnections 86b are formed integral with the conductor plugs 86a. As the material of the conductor plugs 86a and the interconnections 86b, Cu, for example, is used.

On the inter-layer insulation film 80 with the interconnections 86b buried in, an inter-layer insulation film 88 is formed. In the inter-layer insulation film 88, contact holes 90 are formed. In the contact holes 90, conductor plugs 92a are formed, and on the inter-layer insulation film 88, interconnections 92b1-92b6 connected to the conductor plugs 92a are formed. As the material of the conductor plugs 92a and the interconnections 92b1-92b6, aluminum (Al), for example, is used.

Figure 3:
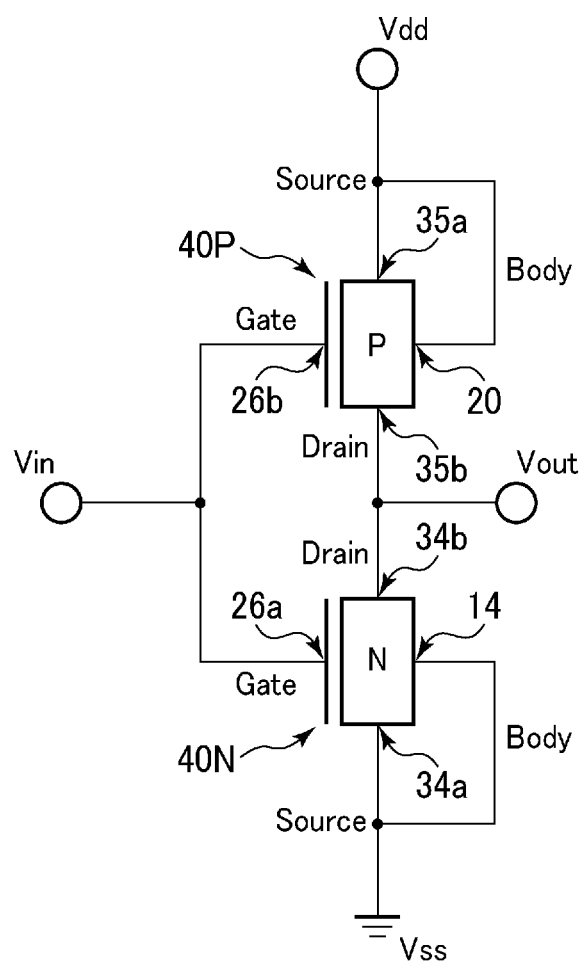
FIG. 3 is a view illustrating a circuit of a part of the semiconductor device according to the first embodiment.

FIG. 3 is the circuit of a part of the semiconductor device according to the present embodiment.

As illustrated in FIGS. 1 and 3, the interconnections 92b1, 92b2 of an input signal Vin are electrically connected to the gate electrode 26a of the N-channel type high withstand voltage transistor 40N and the gate electrode 26b of the P-channel type high withstand voltage transistor 40P.

The source 34a of the N-channel type high withstand voltage transistor 40N and the body (the P-type well) 14 are electrically connected to the interconnection 92b3 connected to the ground potential Vss.

The source 35a and the body (the N-type well) 20 of the P-channel type high withstand voltage transistor 40P is electrically connected to the interconnection 92b4 connected to the power supply potential Vdd.

The drain 34b of the N-channel type high withstand voltage transistor 40N and the drain 35b of the P-channel type high withstand voltage transistor 40P are electrically connected to the interconnection 92b5 of an output signal Vout.

The N-type well 20 is electrically connected to the interconnection 92b6 connected to the power supply potential Vdd via the contact layer 44.

Thus, the CMOS inverter circuit including the N-channel type high withstand voltage transistor 40N and the P-channel type high withstand voltage transistor 40P is constituted.

Thus, the semiconductor device according to the present embodiment is constituted.

Evaluation Result

Next, the evaluation result of the semiconductor device according to the present embodiment will be described.

Figure 4:
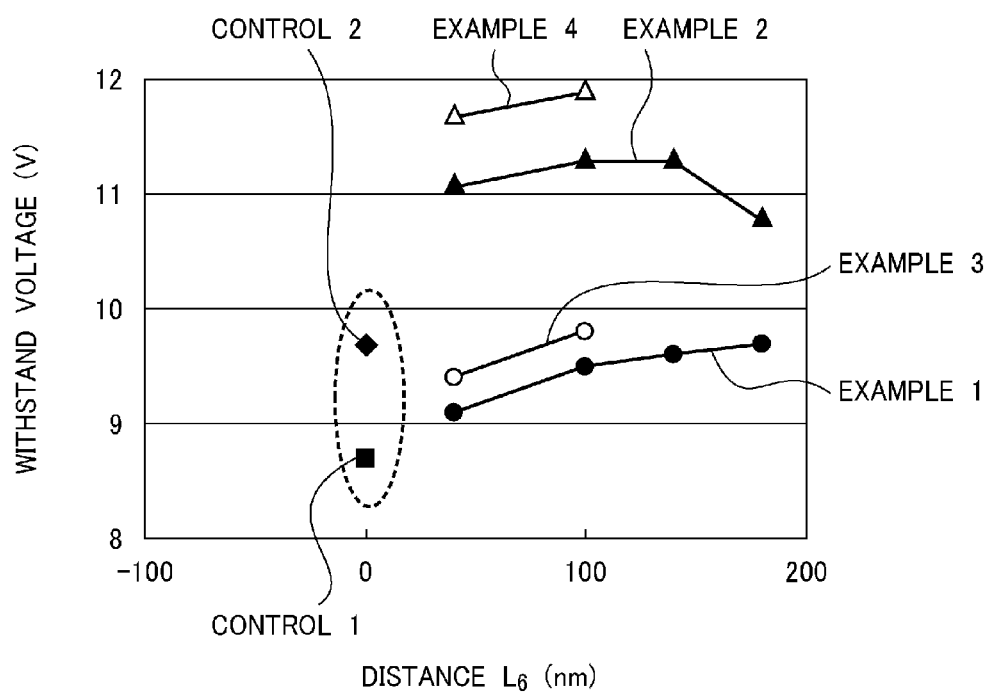
FIG. 4 is a graph of a withstand voltage of a high withstand voltage transistor.

FIG. 4 is a graph of the withstand voltage of the high withstand voltage transistor. In FIG. 4, on the horizontal axis, the distance $L_6$ between the region where the lightly doped drain region 29b is to be formed and the N-type well 16 is taken. In FIG. 4, on the vertical axis, the withstand voltage is taken. The measurement of the withstand voltage illustrated in FIG. 4 was made on the P-channel type high withstand voltage transistor 40P.

The ● plots in FIG. 4 indicate a case of Example 1, that is, the withstand voltage of the P-channel type high withstand voltage transistor 40P under the on-state. When the withstand voltage under the on-state was measured, the voltage of the gate 26b set at −1.2 V, the voltages of the source 35a and the N-type well 20 set at 0 V, and a minus bias voltage applied to the drain 35b was gradually increased.

The ■ plots in FIG. 4 indicate Control 1. Control 1 is the withstand voltage under the on-state in a case that the N-type well 16 is formed in all the P-channel type high withstand voltage transistor-to-be-formed region 2P, and the channel dope layer 23 is formed in all channel region of the P-channel type transistor 40P. In this case, since the lightly doped drain region 29b and the N-type well 16 are not spaced from each other, the distance $L_6$ is 0 nm.

The ▲ plots in FIG. 4 indicate Example 2, that is, the withstand voltage of the P-channel type high withstand voltage transistor 40P under the off-state. When the withstand voltage under the off-state was measured, the voltages of the gate 26b, the source 35a and the N-type well 20 was 0 V, and a minus bias voltage to be applied to the drain 35b was gradually increased.

The ♦ plots in FIG. 4 indicate Control 2. Control 2 is the withstand voltage under the off-state in a case that the N-type well 16 is formed all in the P-channel type high withstand voltage transistor-to-be-formed region 2P, and the channel dope layer 23 is formed in all the channel region of the P-channel type transistor 40P. In this case, since the lightly doped drain region 29b and the N-type well 16 are not spaced from each other, the distance $L_6$ is 0 nm.

In making the measurement of FIG. 4, the distance $L_9$ between the lightly doped drain region 29b and the channel dope layer 23 is set equal to the distance $L_6$ between the region where the lightly doped drain region 29b is to be formed and the N-type well 16.

A illustrated in FIG. 4, Examples 1 and 2, i.e., the semiconductor device according to the present embodiment can sufficiently improve the withstand voltage in comparison with Controls 1 and 2.

As described above, according to the present embodiment, transistors of sufficiently high withstand voltage can be provided.

Figure 5:
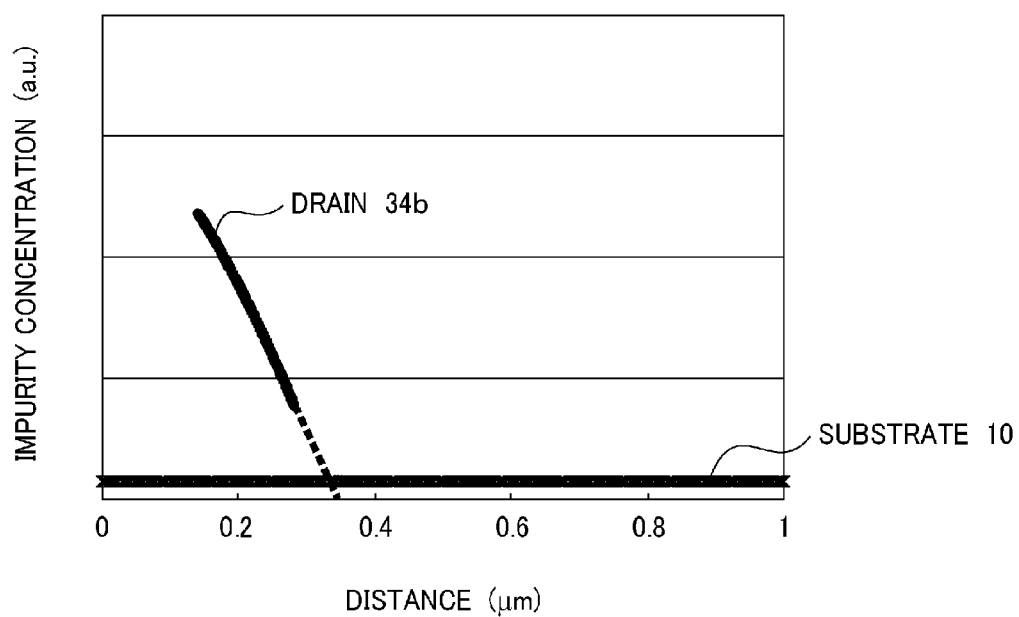
FIG. 5 is a schematic view of an impurity profile of the semiconductor device according to the first embodiment (Part 1)

FIG. 5 is a schematic view of an impurity profile of the semiconductor device according to the present embodiment (Part 1). FIG. 5 is the impurity profile along the B-C line in FIG. 2B. That is, FIG. 5 illustrates the impurity profile along the depth of the drain diffused layer 34b of the N-channel type high withstand voltage transistor 40N. In FIG. 5, on the horizontal axis, the distance from the surface of the semiconductor substrate 10, and in FIG. 5, on the vertical axis, the impurity concentration is taken.

Figure 6:
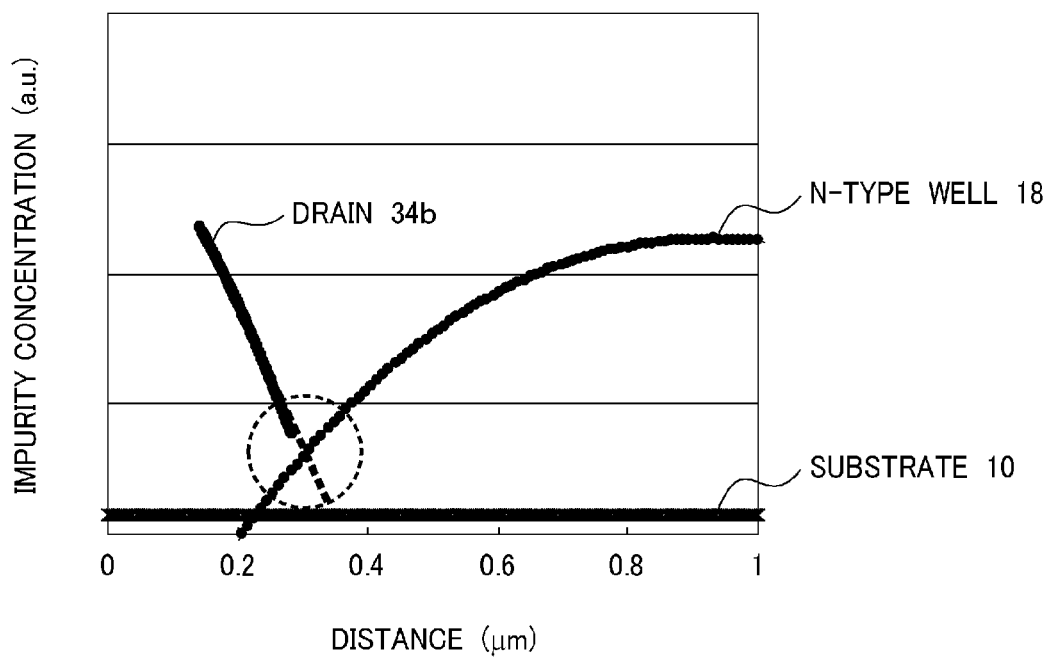
FIG. 6 is a schematic view of the impurity profile of Control 3.

FIG. 6 is a schematic view of the impurity profile of Control 3. Control 3 is the impurity profile along the B-C line in a case that the N-type well 18 is positioned also in the region below the drain diffused layer 34b. In FIG. 6, on the horizontal axis, the distance from the surface of the semiconductor substrate is taken, and in FIG. 6, on the vertical axis, the impurity concentration is taken.

As in Control 3, in a case that the N-type well 18 is positioned in the region below the drain diffused layer 34b, the drain diffused layer 34b and the N-type well 18 are electrically shorted at the position enclosed by the broken line in FIG. 6. In this case, the N-channel type high withstand voltage transistor cannot normally operate.

On the other hand, in the present embodiment, in which the N-type well 18 is not positioned in the region below the drain diffused layer 34b, the drain diffused layer 34b and the N-type well 18 are not electrically shorted at the position along the B-C line (see FIG. 5).

Figure 7:
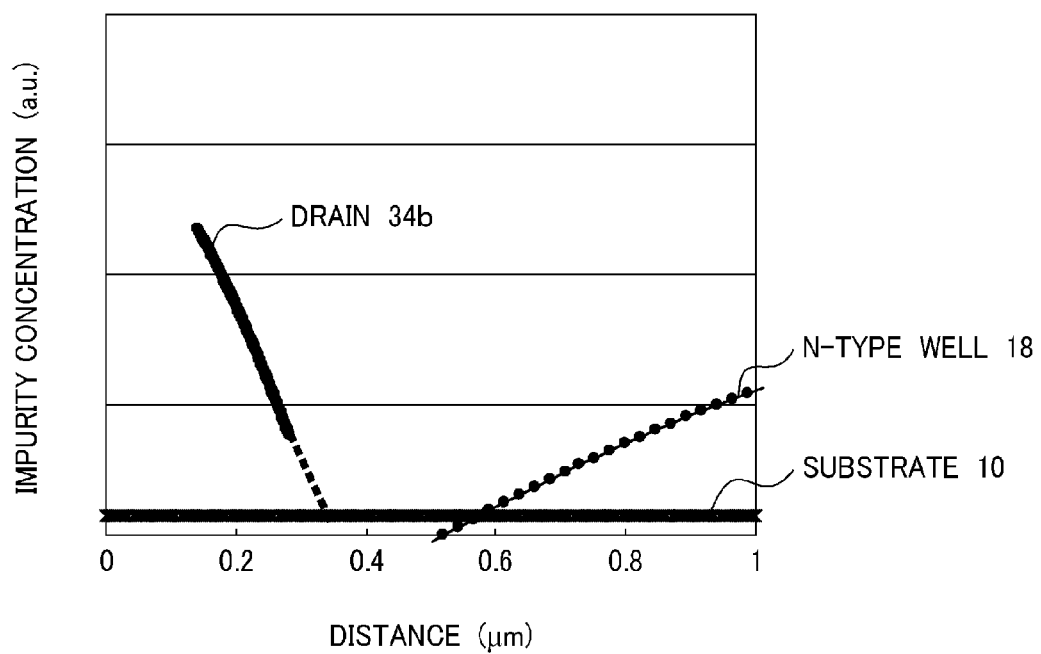
FIG. 7 is a schematic view of an impurity profile of the semiconductor device according to the first embodiment (Part 2)

FIG. 7 is a schematic view of the impurity profiles of the semiconductor device according to the present embodiment (Part 2). FIG. 7 illustrates the impurity profiles along the B-D line in FIG. 2B. In FIG. 7, on the horizontal axis, the distance from the surface of the semiconductor substrate 10, and in FIG. 7, on the vertical axis, the impurity concentration is taken.

The drain diffused layer 34b and the N-type well are sufficiently spaced from each other, whereby as illustrated in FIG. 7, the drain diffused layer 34b and the N-type well 18 are not electrically shorted.

Figure 8:
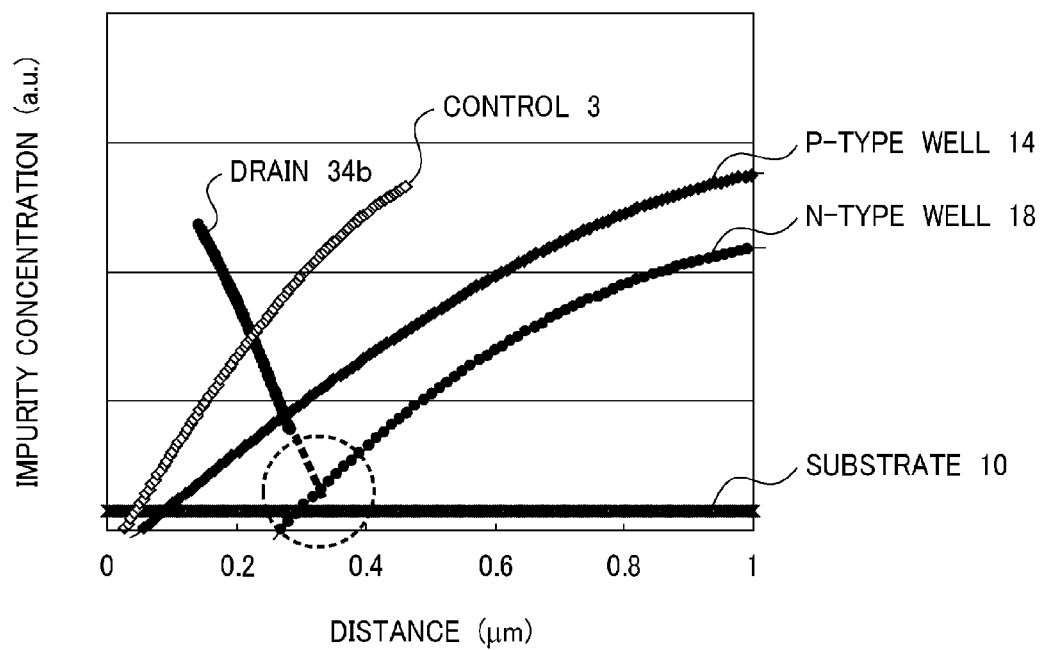
FIG. 8 is a schematic view of an impurity profile of the semiconductor device according to the first embodiment (Part 3)

FIG. 8 is a schematic view of the impurity profiles of the semiconductor device according to the present embodiment (Part 3). FIG. 8 illustrates the impurity profiles along the B-E line in FIG. 2. In FIG. 8, on the horizontal axis, the distance from the surface of the semiconductor substrate 10 is taken, and in FIG. 8, on the vertical axis, the impurity concentration is taken.

At the position enclosed by the broken line in FIG. 8, the impurity concentration of the drain diffused layer 34b and the impurity concentration of the N-type well 18 overlap each other. Without the P-type well 14 between the drain diffused layer 34b and the N-type well 18, there is a risk that the drain diffused layer 34b and the N-type well 18 are electrically shorted at the position enclosed by the broken line in FIG. 8.

However, in the present embodiment, the P-type well 14 is present between the drain diffused layer 34b and the N-type well 18, whereby the drain diffused layer 34b and the N-type well 18 are not shorted.

Control 3 in FIG. 8 illustrates the impurity profile in a case that the distance $L_2$ between the edge of the device isolation region 12 on the side of the drain diffused layer 34b and the edge of the P-type well 14 on the side of the drain diffused layer 34b is set at 0 μm.

In Control 3, since blunt impurity profiles are not obtained between the drain diffused layer 34b and the P-type well 14, and accordingly it is difficult that the N-channel type transistor can be of sufficiently high withstand voltage.

Thus, it is preferable to space the edge of the P-type well 14 on the side of the drain diffused layer 34b by some extent from the region where the lightly doped drain region 32b is to be formed.

Figure 9:
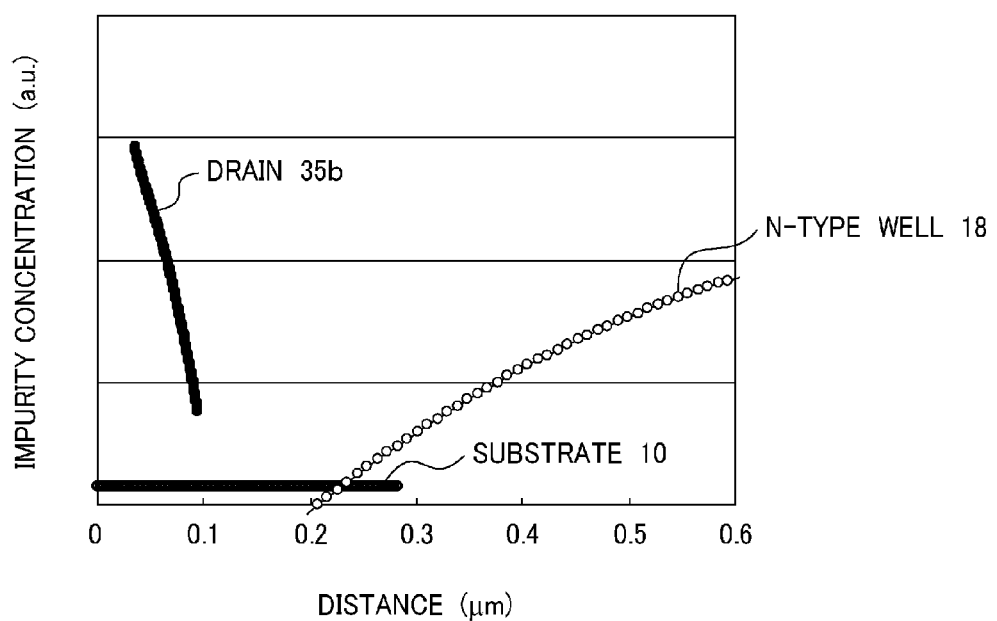
FIG. 9 is a schematic view of an impurity profile of the semiconductor device according to the first embodiment (Part 4)

FIG. 9 is a schematic view of the impurity profiles of the semiconductor device according to the present embodiment (Part 4). FIG. 9 illustrates the impurity profiles along the F-G line in FIG. 2B. That is, FIG. 9 illustrates the impurity profiles of the P-channel type high withstand voltage transistor 40P along the depth of the drain diffused layer 35b. In FIG. 9, on the horizontal axis, the distance from the surface of the semiconductor substrate 10 is taken, and in FIG. 9, on the vertical axis, the impurity concentration is taken.

Between the drain diffused layer 35b and the N-type well 18, a part in which no dopant impurity is implanted, i.e., a part of the semiconductor substrate 10 is present, whereby the drain diffused layer 35b and the N-type well 18 are not electrically shorted.

According to the present embodiment, as illustrated in FIG. 9, the drain diffused layer 35b and the N-type well 18 are sufficiently isolated electrically from each other, whereby the semiconductor device can include the P-channel type high withstand voltage transistor 40P of sufficiently high withstand voltage.

Figure 10:
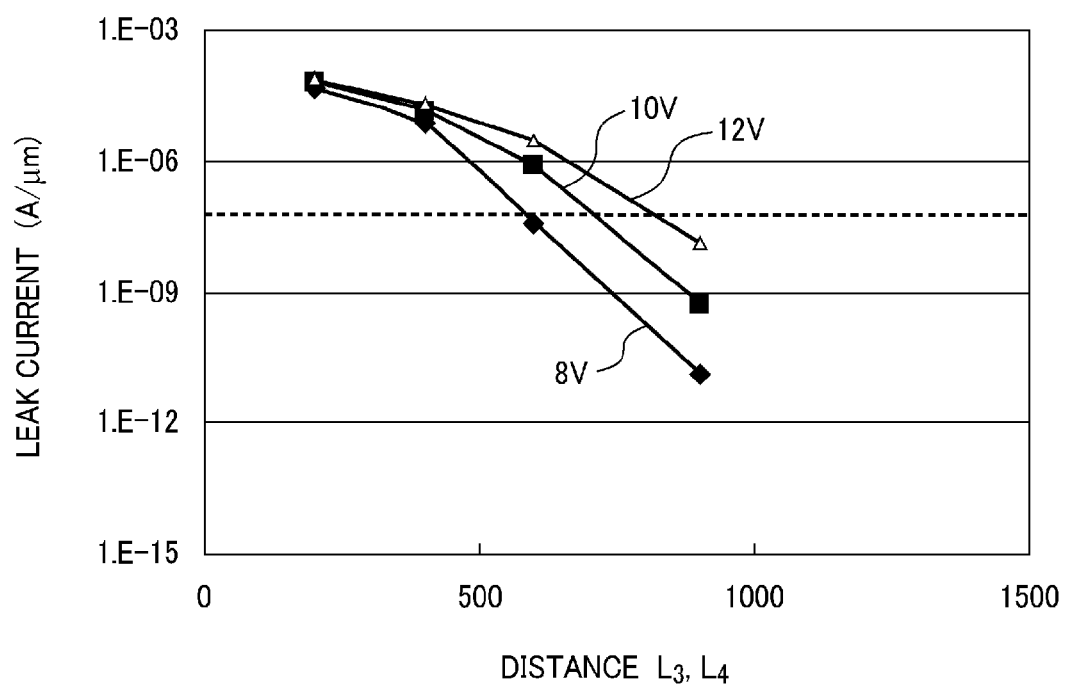
FIG. 10 is a graph of a leak current of the high withstand voltage transistor.

FIG. 10 is a graph of the leak current of the high withstand voltage transistor. The measurement of the leak current illustrated in FIG. 10 was made on the N-channel type high withstand voltage transistor 40N. In FIG. 10, on the horizontal axis, the distances $L_3$, $L_4$ between the edge of the drain diffused layer 34b of the P-type well 14 and edge of the N-type well 18 on the side of the drain diffused layer 34b are taken. In FIG. 10, on the vertical axis, the leak current between the drain 34b and the N-type well 18 is taken. In FIG. 10, the ♦ plots indicate the leak current with the drain voltage set at 8 V. In FIG. 10, the ■ plots indicate the leak current with the drain voltage set at 10 V. In FIG. 10, the Δ plots indicate the leak current with the drain voltage set at 12 V.

In making the measurement of FIG. 10, the potentials of the gate 26a, the source 34a and the body (the P-type well) 14 and the N-type well 20 were 0 V, and the value of the distance $L_3$ and value of the distance $L_4$ were set equal to each other.

In FIG. 10, the dot line indicates the target value, and it is preferable that the leak current is smaller than the target value.

As illustrated in FIG. 10, as the distances $L_3$, $L_4$ between the edge of the P-type well 14 on the side of the drain diffused layer 34b and the edge of the N-type well 18 on the side of the drain diffused layer 34b are made larger, the leak current becomes smaller.

Thus, for making the leak current sufficiently low, it is preferable that the distances $L_3$, $L_4$ between the edge of the P-type well 14 on the side of the drain diffused layer 34b and the edge of the N-type well 18 on the side of the drain diffused layer 34b is 1 μm or above.

As described above, in the present embodiment, the channel dope layer 23 and the N-type well 16 are formed in the region spaced from the region where the lightly doped drain region 29b is to be formed. Thus, in the present embodiment, blunt impurity profiles can be obtained between the channel dope layer 23 and the lightly doped drain region 29b and between the lightly doped drain region 29b and the N-type well 16. Consequently, according to the present embodiment, even when a high voltage is applied to the drain diffused layer 35b, the concentration of an electric filed can be sufficiently mitigated, and the withstand voltage can be made sufficient. Because of the N-type well 18 buried in the region below the drain region 35b, the drain region 35b can be electrically isolated from the semiconductor substrate 10, and the P-channel type transistor 40P can be obtained. Furthermore, according to the present embodiment, the lightly doped drain region 29b and the lightly doped source region 29a are formed in the same process. The lightly doped drain region 29b is not formed in a process different from a process of forming the lightly doped source region 29a, which can suppress the number of processes. Thus, according to the present embodiment, the semiconductor device can include required conduction type high withstand voltage transistors while suppressing the number of manufacturing processes.

In the present embodiment, the channel dope layer 23 is formed in the region spaced from the region where the lightly doped drain region 29b is to be formed, whereby the high withstand voltage transistor 40P whose on resistance is low can be obtained. Thus, according to the present embodiment, the semiconductor device can include high withstand voltage transistors of good electric characteristics.

Method for Manufacturing the Semiconductor Device

Next, the method for manufacturing the semiconductor device according to the present embodiment will be described with reference to FIGS. 11A to 19. FIG. 11A to 19 are sectional views of the semiconductor device in the steps of the method for manufacturing the semiconductor device, which illustrate the method.

Figure 11A:
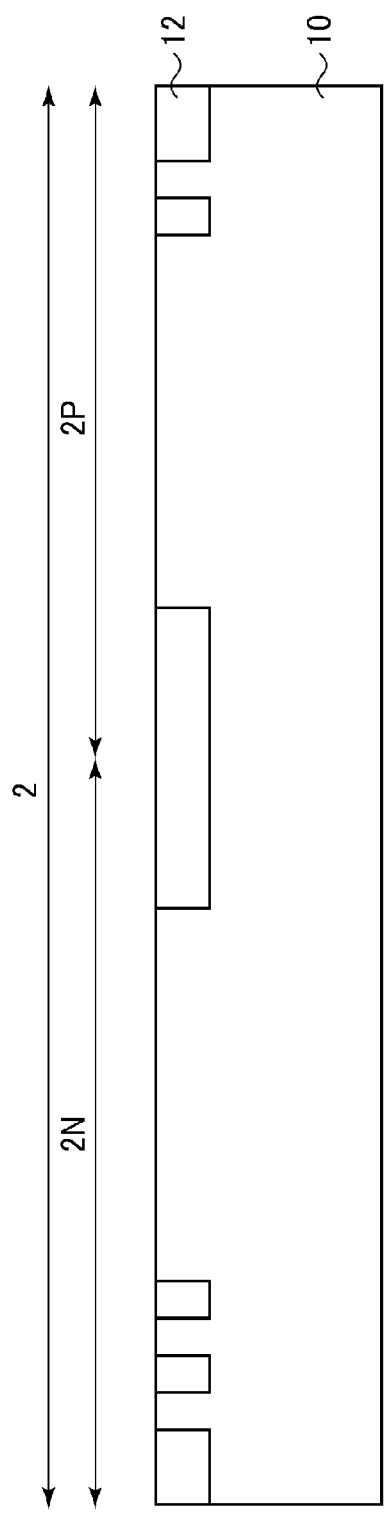
Figure 11B:
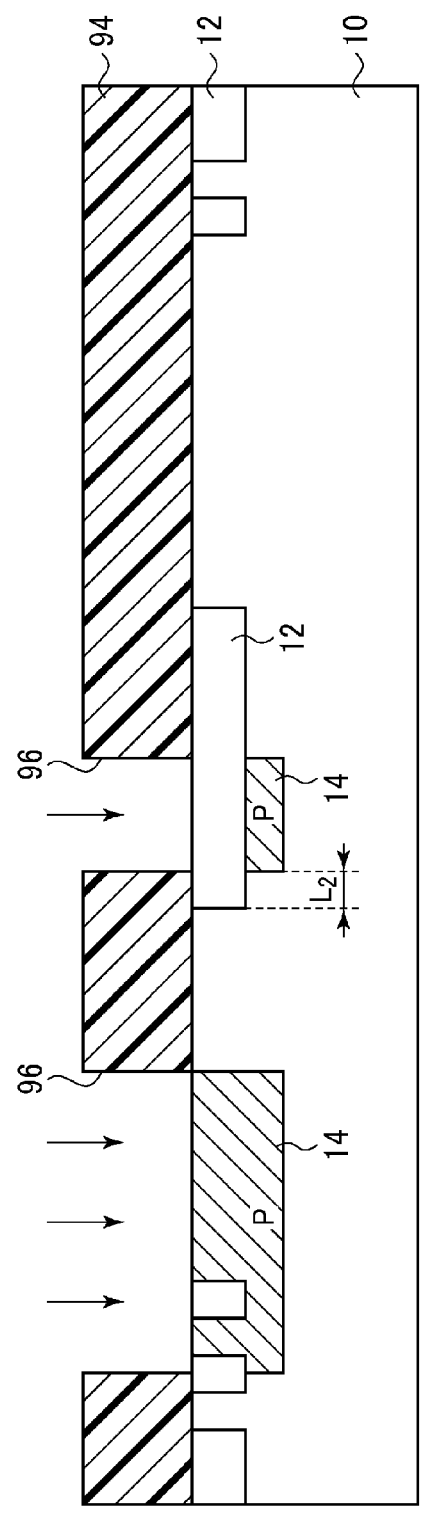
Figure 13A:
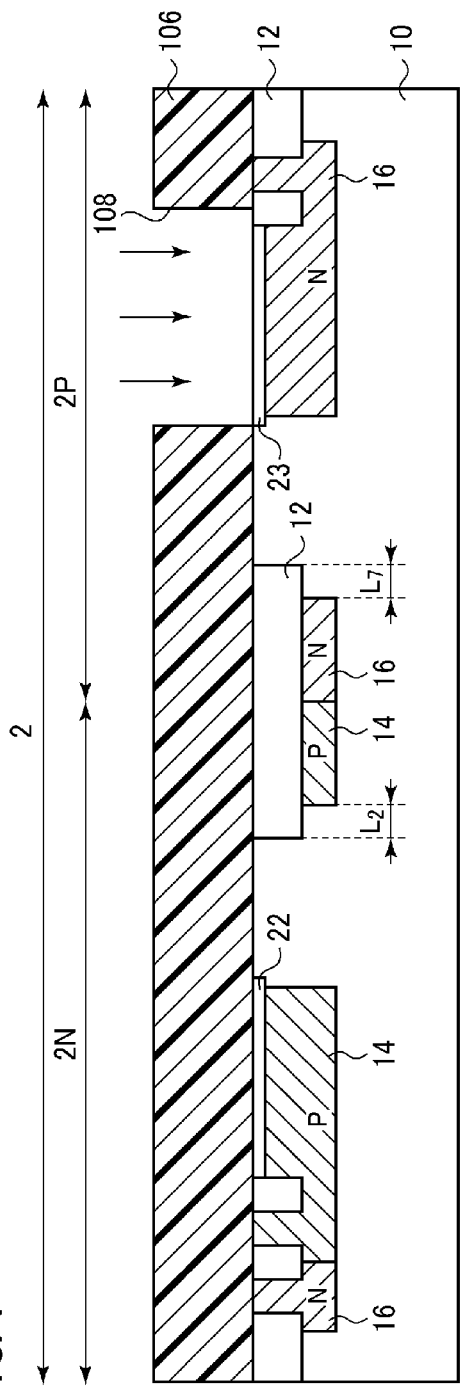
Figure 13B:
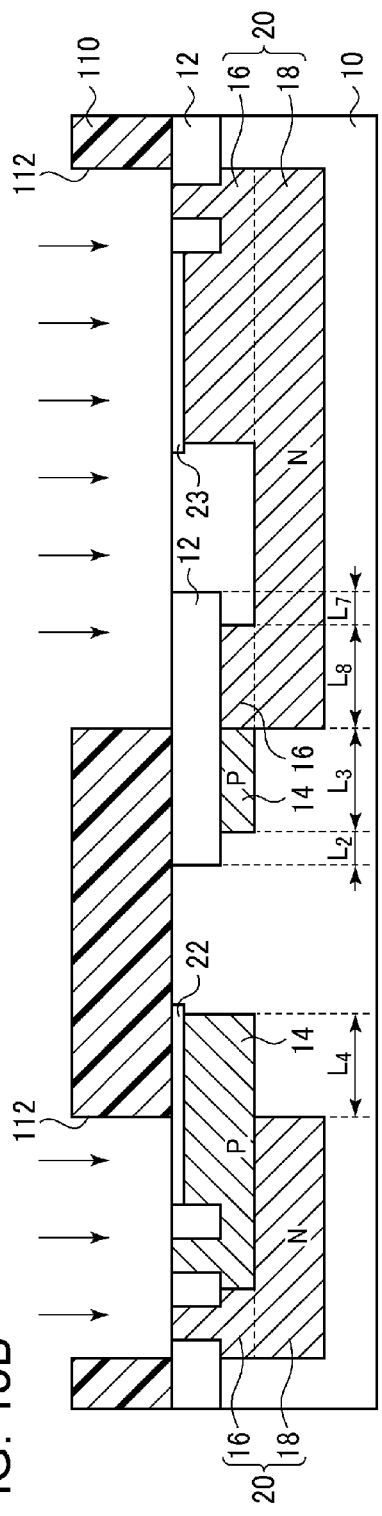

First, as illustrated in FIG. 11A, the device isolation regions 12 defining the device region are formed by, e.g., STI. The depth of the device isolation regions 12 is, e.g., about 0.2-0.3 μm.

Next, on the entire surface, a photoresist film 94 is formed by, e.g., spin coating.

Then, the photoresist film 94 is patterned by photolithography. Thus, the openings 96 for forming the P-type well 14 are formed in the photoresist film 94 (see FIG. 11B). The openings 96 for forming the P-type well 14 and the region for the dopant impurity to be implanted to form the lightly doped drain region 28b (see FIG. 14B) are spaced from each other in the design data and the reticle.

Then, by, e.g., ion implantation with the photoresist film 94 as the mask, a P-type dopant impurity is implanted into the semiconductor substrate 10 to form the P-type well 14. When the P-type dopant impurity is implanted, the P-type dopant impurity is so implanted that the edge of the device isolation region 12 on the side of the drain diffused layer 34b (see FIG. 1) and the edge of the P-type well 14 on the side of the drain diffused layer 34b becomes, e.g., about 0.1-0.6 μm. As the P-type dopant impurity, boron (B), for example, is used. The acceleration energy is, e.g., 100-200 keV. The dose is, e.g., $2\times10^{13}$-$5\times10^{13}$ cm$^{-2}$. The P-type well 14 is formed in the region except the region where the lightly doped drain region 28b is to be formed, enclosing the lightly doped drain region 28b and spaced from the region where the lightly doped drain region 28b is to be formed. That is, the P-type well 14 is formed, spaced from the region where the dopant impurity for forming the lightly doped region 28b is to be formed.

Then, the photoresist film 94 is released by, e.g., asking.

Next, on the entire surface, a photoresist film 98 is formed by, e.g., spin coating.

Then, the photoresist film 98 is patterned by photolithography. Thus, openings 100 for forming the N-type diffused layer (the N-type well) 16 are formed in the photoresist film 98 (see FIG. 12A).

Next, by, e.g., ion implantation with the photoresist film 98 as the mask, an N-type dopant impurity is implanted into the semiconductor substrate 10 to form the N-type diffused layer (the N-type well) 16. When the N-type dopant impurity is implanted, the N-type dopant impurity is so implanted that the distance $L_7$ between the edge of the device isolation region 12 contacting the drain diffused layer 35b (see FIG. 1) and the edge of the N-type well 16 on the side of the drain diffused layer 35b is, e.g., about 0.1-0.6 μm. As the N-type dopant impurity, phosphorus (P), for example, is used. The acceleration energy is, e.g., about 300-400 keV. The dose is about $2\times10^{13}$-$5\times10^{13}$ cm$^{-2}$. Thus, in the region except the region where the lightly doped drain region 29b of the P-channel type high withstand voltage transistor 40P is to be formed, the N-type well 16 is formed, enclosing the lightly doped drain region 29b and spaced from the region where the lightly doped drain region 29b is to be formed. The N-type diffused layer 16 is formed, enclosing the side of the P-type well 14.

Then, the photoresist film 98 is released by, e.g., asking.

Next, a photoresist film 102 is formed on the entire surface by, e.g., spin coating.

Next, the photoresist film 102 is patterned by photolithography. Thus, an opening 104 for forming the channel dope layer 22 is formed in the photoresist film 102 (see FIG. 12B). The opening 104 for forming the channel dope layer 22, and the region (see FIG. 14B) where the dopant impurity for forming the lightly doped drain region 28b is to be implanted are spaced from each other in the design data and on the reticle.

Then, by, e.g., ion implantation with the photoresist film 102 as the mask, a P-type dopant impurity is implanted into the semiconductor substrate 10 to form the channel dope layer 22. As the P-type dopant impurity, B, for example, is used. The acceleration energy is, e.g., 20-40 keV. The dose is about $2\times10^{12}$-$5\times10^{12}$ cm$^{-2}$. Thus, the channel dope layer 22 is formed. The channel dope layer 22 in the N-channel type high withstand voltage transistor to-be-formed region 40N is formed, spaced from the region where the lightly doped drain region 28b is to be formed. That is, the channel dope layer 22 is formed, spaced from the region where the dopant impurity for forming the lightly doped drain region 28b is to be implanted.

Then, the photoresist film 102 is released by, e.g., asking.

Next, a photoresist film 106 is formed on the entire surface by, e.g., spin coating.

Next, the photoresist film 106 is patterned by photolithography. Thus, an opening 108 for forming the channel dope layer 23 is formed in the photoresist film 106 (see FIG. 13A). The opening 108 for forming the channel dope layer 23, and the region (see FIG. 15A) where the dopant impurity for forming the lightly doped drain region 29b is to be formed are spaced from each other in the design data and on the reticle.

Then, by, e.g., ion implantation with the photoresist film 106 as the mask, an N-type dopant impurity is implanted into the semiconductor substrate 10 to form the channel dope layer 23. As the N-type dopant impurity, arsenic (As), for example, is used. The acceleration energy is, e.g., about 100-200 keV. The dose is about $1 \times 10^{13}$-$5 \times 10^{13}$ $cm^{-2}$. Thus, the channel dope layer 23 is formed. The channel dope layer 23 of the P-channel type high withstand voltage transistor-to-be-formed region 40P is formed, spaced from the lightly doped drain region 29b (see FIG. 15A). That is, the channel dope layer 23 is formed, spaced from the region where the dopant impurity for forming the lightly doped drain region 29b is to be implanted.

Then, the photoresist film 106 is released by, e.g., asking.

Next, a photoresist film 110 is formed on the entire surface by, e.g., spin coating.

Next, the photoresist film 110 is patterned by photolithography. Thus, openings 112 for forming the N-type buried diffused layers 18 are formed in the photoresist film 110 (see FIG. 13B).

Then, by, e.g., ion implantation with the photoresist film 110 as the mask, an N-type dopant impurity is implanted into the semiconductor substrate 10 to form the N-type buried diffused layer 18. When the N-type dopant impurity is implanted, the N-type dopant impurity is so implanted that the distances $L_3$, $L_4$ between the edge of the P-type well 14 on the side of the drain 34b and between the edge of the N-type well 18 on the side of the drain 34b is, e.g., about 1-1.5 μm. As the N-type dopant impurity, P, for example, is used. The acceleration energy is, e.g., about 700-900 keV. The dose is about $1 \times 10^{13}$-$5 \times 10^{13}$ $cm^{-2}$. Thus, the N-type buried layer 18 is formed. The N-type buried layer 18 is positioned below the N-type diffused layer 16. The N-type buried diffused layer 18 and the N-type diffused layer 16 are connected to each other. The N-type diffused layer 16 and the N-type buried diffused layer 18 form the N-type well 20. In the N-channel type high withstand voltage transistor-to-be-formed region 2N, the N-type buried diffused layer 18 is formed so that the edge of the N-type buried diffused layer 18 on the side of the drain diffused layer 34b is spaced from the edge of the P-type well 14 on the side of the drain diffused layer 34b. In the P-channel type high withstand voltage transistor-to-be-formed region 2P, the part of the semiconductor substrate 10, which is enclosed by the N-type diffused layer 16 is electrically isolated from the semiconductor substrate 10 by the N-type well 20.

Then, the photoresist film 110 is released by, e.g., ashing.

Next, the gate insulation film 24 of, e.g., a 6 nm-film thickness silicon oxide film is formed on the surface of the semiconductor substrate 10 by, e.g., thermal oxidation.

Next, a polysilicon film of, e.g., a 100-150 nm film thickness is formed by, e.g., CVD.

Figure 14A:
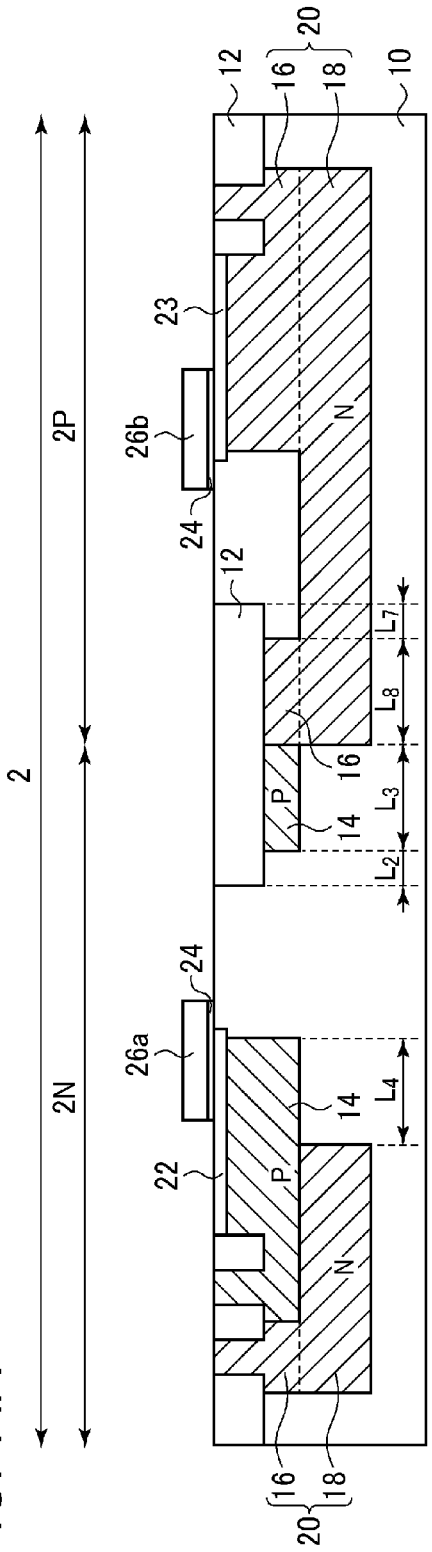
Figure 14B:
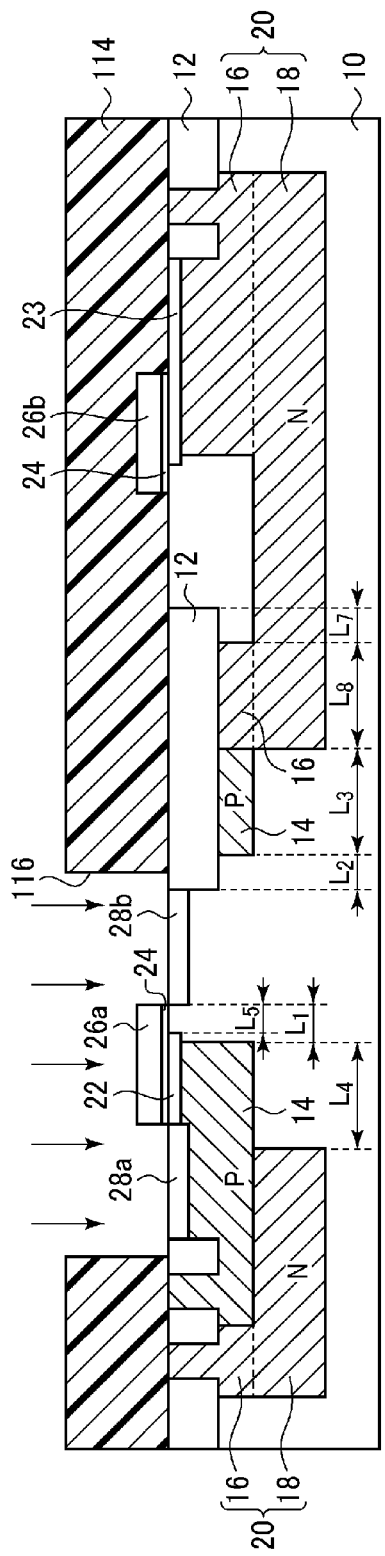
Figure 18:
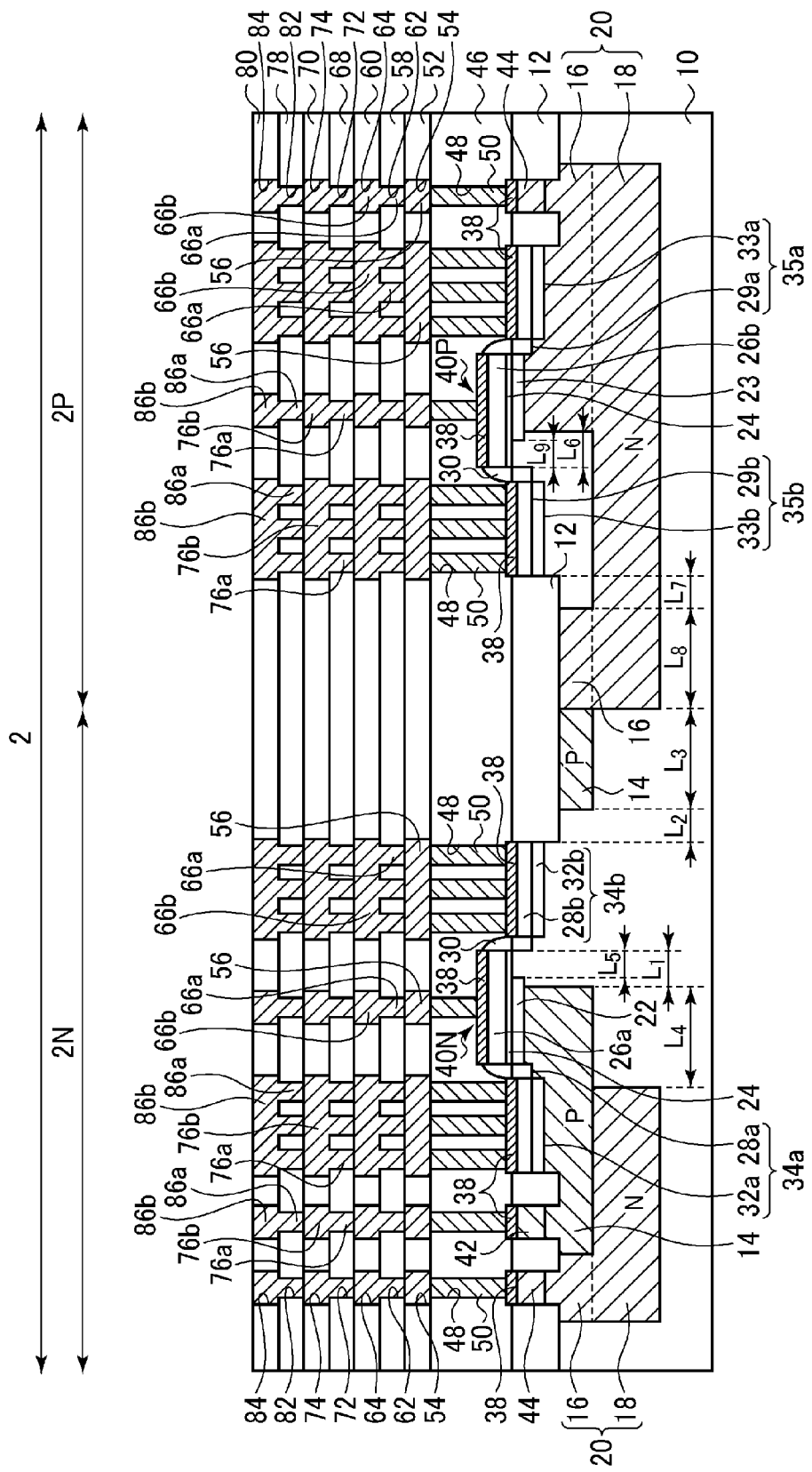

Then, the polysilicon film is patterned by photolithography to form the gate electrodes 26a, 26b of polysilicon (see FIG. 14A).

Next, a photoresist film 114 is formed on the entire surface by, e.g., spin coating.

Next, the photoresist film 114 is patterned by photolithography. Thus, an opening 116 for exposing the N-channel type high withstand voltage transistor-to-be-formed region 2N is formed in the photoresist film 14 (see FIG. 14B).

Next, by, e.g., ion implantation with the photoresist film 114 as the mask, an N-type dopant impurity is implanted into the semiconductor substrate 10 to form the N-type lightly doped diffused layers (the extension regions) 28a, 28b. As the N-type dopant impurity, P, for example, is used. The acceleration energy is, e.g., about 20-40 keV. The dose is $2 \times 10^{13}$-$5 \times 10^{13}$ $cm^{-2}$. Thus, the N-type lightly doped diffused layers 28a, 28b are formed.

Then, the photoresist film 114 is released by, e.g., ashing.

Then, a photoresist film 118 is formed on the entire surface by, e.g., spin coating.

Next, the photoresist film 118 is patterned by photolithography. Thus, an opening 120 for exposing the P-channel type high withstand voltage transistor-to-be-formed region 2P is formed in the photoresist film 118 (see FIG. 15A).

Next, by, e.g., ion implantation with the photoresist film 118 as the mask, a P-type dopant impurity is implanted into the semiconductor substrate 10 to form the P-type lightly doped diffused layers (the extension regions) 29a, 29b. As the P-type dopant impurity, boron fluoride, for example, is used. The acceleration energy is, e.g., about 10-30 keV. The dose is about $2 \times 10^{13}$-$5 \times 10^{13}$ $cm^{-2}$. Thus, the P-type lightly doped diffused layers 29a, 29b are formed.

Then, the photoresist film 118 is released by, e.g., asking.

Next, a silicon oxide film of, e.g., a 100 nm-film thickness is formed on the entire surface by, e.g., CVD.

Then, the silicon oxide film is anisotropically etched to form the sidewall insulation film 30 of the silicon oxide film on the side walls of the gate electrodes 26a, 26b (see FIG. 15B).

Next, a photoresist film 122 is formed on the entire surface by, e.g., spin coating.

Then, the photoresist film 122 is patterned by photolithography. Thus, openings 124 for respectively exposing the N-channel type high withstand voltage transistor-to-be-formed region 2N and the region where the N-type contact region 44 is to be formed are formed in the photoresist film 122 (see FIG. 16A).

Next, by, e.g., ion implantation with the photoresist film 122 as the mask, an N-type dopant impurity is implanted into the semiconductor substrate 10 to from the N-type heavily doped diffused layers 32a, 32b and the N-type contact region 44. As the N-type dopant impurity, P, for example, is used. The acceleration energy is, e.g., about 8-10 keV. The dose is about $5 \times 10^{15}$-$8 \times 10^{15}$ $cm^{-2}$. Thus, the N-type heavily doped diffused layers 32a, 32b and the N-type contact region 44 are formed. The lightly doped diffused layers 28a, 28b and the heavily doped diffused layers 32a, 32b form the source/drain diffused layers 34a, 34b of the extension source/drain structure or the LDD structure.

Then, the photoresist film 122 is released by, e.g., ashing.

Next, a photoresist film 126 is formed on the entire surface by, e.g., spin coating.

Next, the photoresist film 126 is patterned by photolithography. Thus, openings 128 for respectively exposing the P-channel type high withstand voltage transistor-to-be-formed region 2P and a P-type contact region 42 are formed in the photoresist film 126 (see FIG. 16B).

Then, by, e.g., ion implantation with the photoresist film 126 as the mask, a P-type dopant impurity is implanted into the semiconductor substrate 10 to form the P-type heavily doped diffused layers 33a, 33b and the P-type contact region 42. As the P-type dopant impurity, B (boron), for example, is used. The acceleration energy is, e.g., about 4-10 keV. The dose is about $4 \times 10^{15}$-$6 \times 10^{15}$ cm$^{-2}$. Thus, the P-type heavily doped diffused layers 33a, 33b and the N-type contact region 42 are formed. The lightly doped diffused layers 29a, 29b and the heavily doped diffused layers 33a, 33b form the source/drain diffused layers 35a, 35b of the extension source/drain structure or the LDD structure.

Then, the photoresist film 120 is released by, e.g., ashing.

Next, anneal (heat processing) for activating the dopant impurities implanted into the semiconductor substrate 10 is made. The heat processing temperature is, e.g., about 1000° C. The heat processing period of time is, e.g., about 1 second.

Next, a refractory metal film of, e.g., a 20-50 nm-film thickness cobalt film or nickel film is formed on the entire surface.

Then, heat processing is made to react the silicon atoms in the semiconductor substrate 10 and the metal atoms in the refractory metal film with each other while reacting the silicon atoms in the gate electrodes 26a, 26b and the metal atoms in the refractory metal film with each other. Then, the unreacted refractory metal film is removed. Thus, the silicide film 38 of, e.g., cobalt silicide or nickel silicide is formed on the source/drain diffused layers 34a, 34b, 35a, 35b, on the gate electrodes 26a, 26b and on the contact regions 42, (see FIG. 17A).

Next, the inter-layer insulation film 46 of, e.g., a 400 nm-film thickness silicon oxide film is formed on the entire surface by, e.g., CVD (see FIG. 17B).

Next, by photolithography, the contact holes 48 are formed in the inter-layer insulation film 46 respectively down to the silicide film 38.

Next, a 10-20 nm-film thickness Ti film and a 10-20 nm-film thickness TiN film are sequentially stacked on the entire surface by, e.g., sputtering to form the barrier film (not illustrated).

Next, a tungsten film of, e.g., a 300 nm-film thickness is formed by, e.g., CVD.

Next, the tungsten film is polished by, e.g., CMP (Chemical Mechanical Polishing) until the surface of the inter-layer insulation film 46 is exposed. Thus, the conductor plugs 50 of, e.g. tungsten are buried in the contact holes 48.

Then, the inter-layer insulation film 52 of, e.g., a 600 nm-film thickness silicon oxide film is formed on the entire surface by, e.g., CVD.

Next, the trenches 54 for the interconnections 56 to be buried are formed in the inter-layer insulation film 52 by photolithography.

Next, a Cu film, for example, is formed by, e.g., electroplating.

Then, the Cu film is polished by, e.g., CMP until the surface of the inter-layer insulation film 52 is exposed. Thus, the interconnections 56 of Cu are buried in the trenches 54.

Then, the inter-layer insulation film 58 is formed on the entire surface by, e.g., CVD.

Next, the inter-layer insulation film 60 is formed on the entire surface by, e.g., CVD.

Next, the contact holes 62 are formed in the inter-layer insulation film 58 down to the interconnections 56 by photolithography while the trenches 64 are formed in the inter-layer insulation film 60, connected to the contact holes 62.

Next, a Cu film, for example, is formed by, e.g., electroplating.

Then, the Cu film is polished by, e.g., CMP until the surface of the inter-layer insulation film 60 is exposed. Thus, the conductor plugs 66a of Cu are buried in the contact holes 62 while the interconnections 66b of Cu are buried in the trenches 64.

Next, the inter-layer insulation film 68 is formed on the entire surface by, e.g., CVD.

Next, the inter-layer insulation film 70 is formed on the entire surface by, e.g., CVD.

Then, by photolithography, the contact holes 72 down to the interconnections 66b are formed in the inter-layer insulation film 68 while the trenches 74 connected to the contact holes 72 are formed in the inter-layer insulation film 70.

Next, a Cu film for example, is formed by, e.g., electroplating.

Then, the Cu film is polished by, e.g., CMP until the surface of the inter-layer insulation film 70 is exposed. Thus, the conductor plugs 76a of Cu are buried in the contact holes 72 while the interconnections 76b of Cu are buried in the trenches 74.

Next, the inter-layer insulation film 78 is formed on the entire surface by, e.g., CVD.

Next, the inter-layer insulation film 80 is formed on the entire surface by, e.g., CVD.

Next, by photolithography, the contact holes 82 down to the interconnections 76b are formed in the inter-layer insulation film 78 while the trenches 84 connected to the contact holes 82 are formed in the inter-layer insulation film 80.

Next, a Cu film, for example, is formed by, e.g., electroplating.

Then, the Cu film is polished by, e.g., CMP until the surface of the inter-layer insulation film 80 is exposed. Thus, the conductor plugs 86a of Cu are buried in the contact holes 82 while the interconnections 86b of Cu are buried in the trenches 84 (see FIG. 18).

Next, the inter-layer insulation film 88 of, e.g., an 800 nm-film thickness silicon oxide film is formed on the entire surface by, e.g., CVD.

Next, by photolithography, the contact holes 90 down to the interconnections 86b are formed in the inter-layer insulation film 88.

Next, an Al film, for example, is formed by, e.g., sputtering.

Then, the Al film is patterned by photolithography. Thus, the conductor plugs 92a of Al are buried in the contact holes 90 while the interconnections 92b1-92b6 of Al connected to the conductor plugs 92a are formed.

Figure 19:
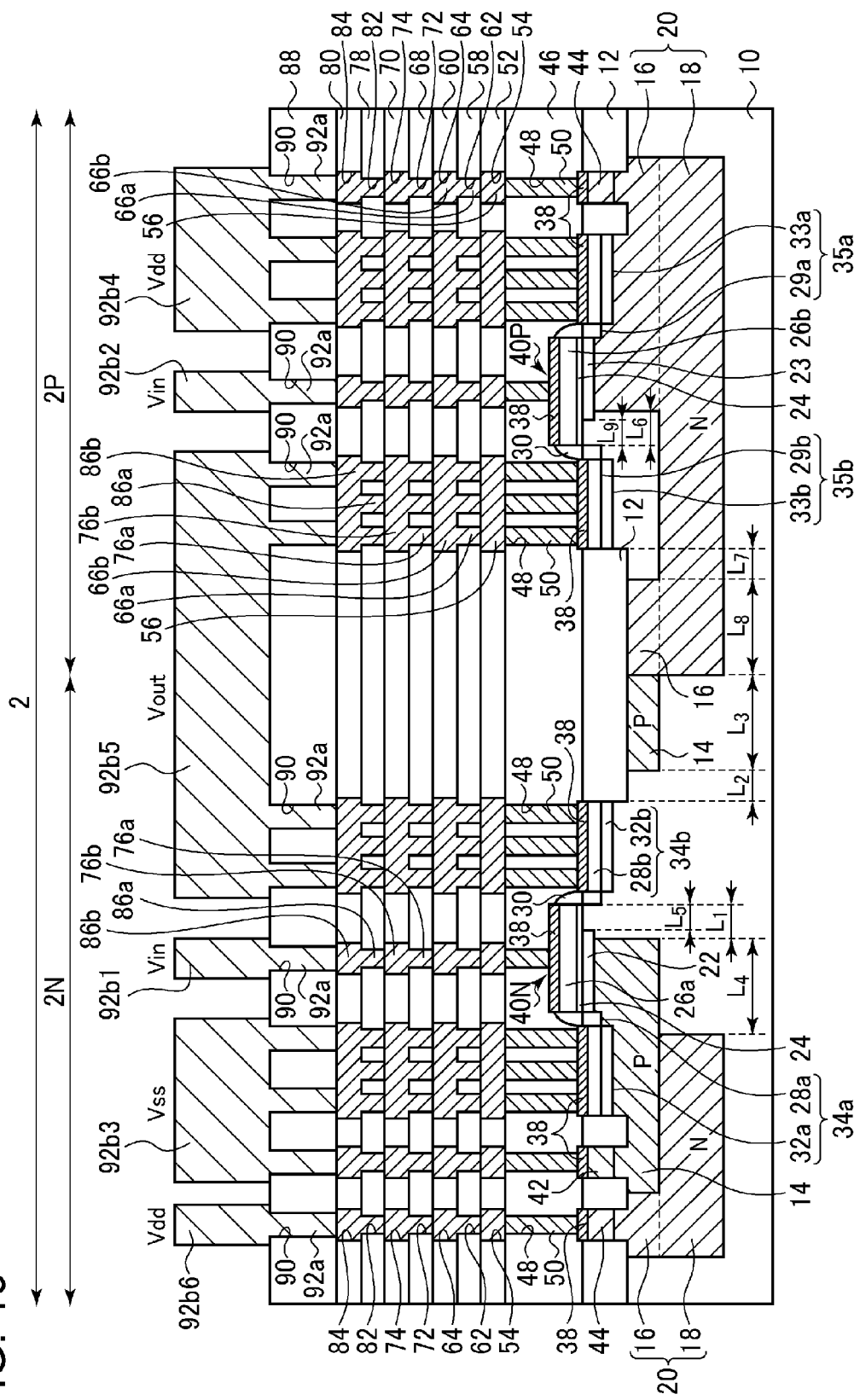

Thus, the semiconductor device according to the present embodiment is manufactured (see FIG. 19)

As described above, in the present embodiment, the channel dope layers 22, 23 are formed, spaced from the regions where the dopant impurity for forming the lightly doped drain regions 28b, 29b is to be implanted, whereby the impurity profiles on the sides of the drains 34, 35 are blunt. Accordingly, in the present embodiment, the discrete processes of forming the lightly doped source regions 28a, 29a and forming the lightly doped drain regions 28b, 29b are not necessary. That is, the discrete photoresist films for forming the lightly doped drain regions 28b, 29b and forming the lightly doped source regions 28a, 29a are not necessary. Thus, according to the present embodiment, the high withstand voltage transistors 40N, 40P can be formed with the manufacturing processes simplified.

A Modification

Figure 20:
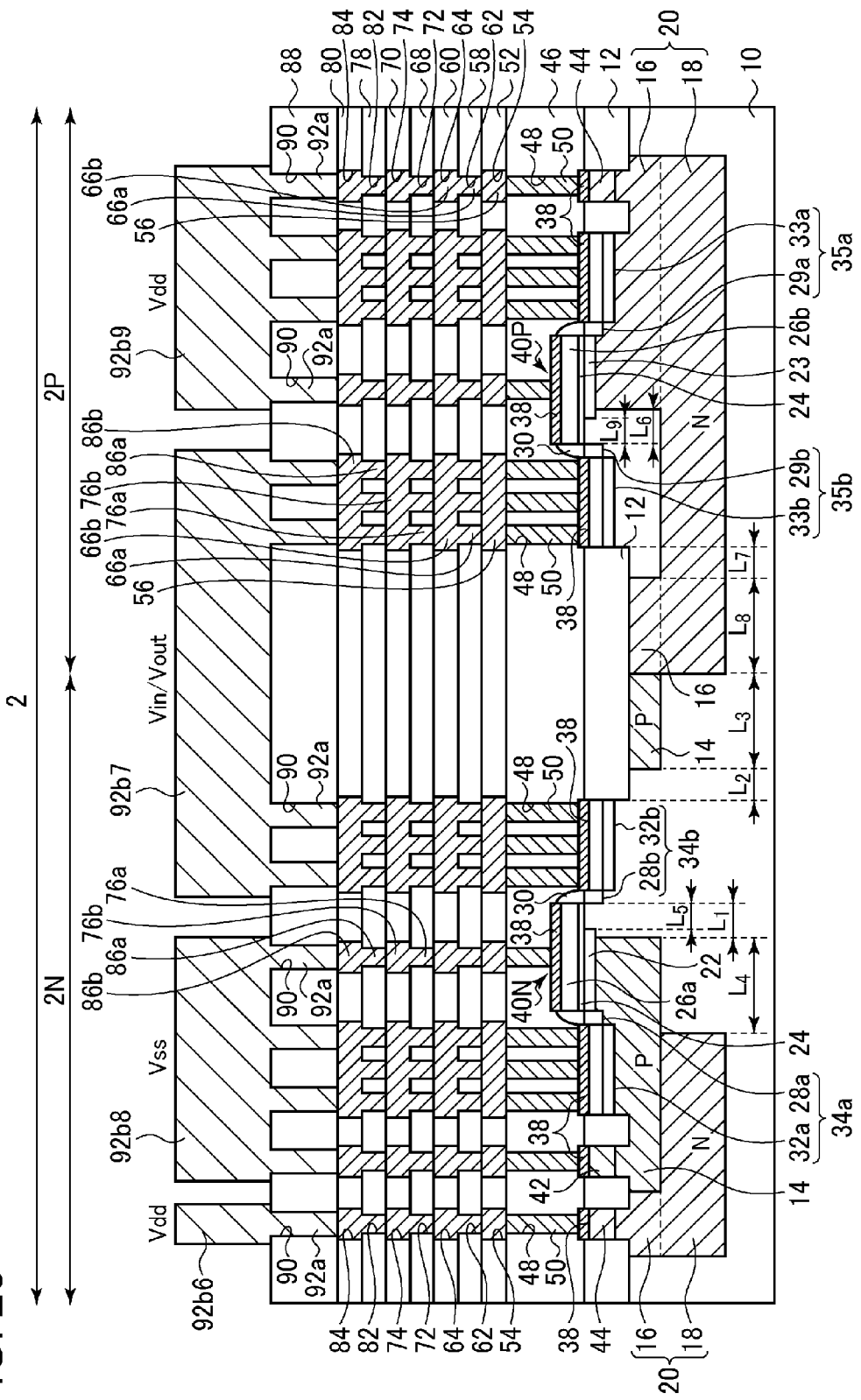
FIG. 20 is a sectional view of a semiconductor device according to a modification of the first embodiment.
Figure 21:
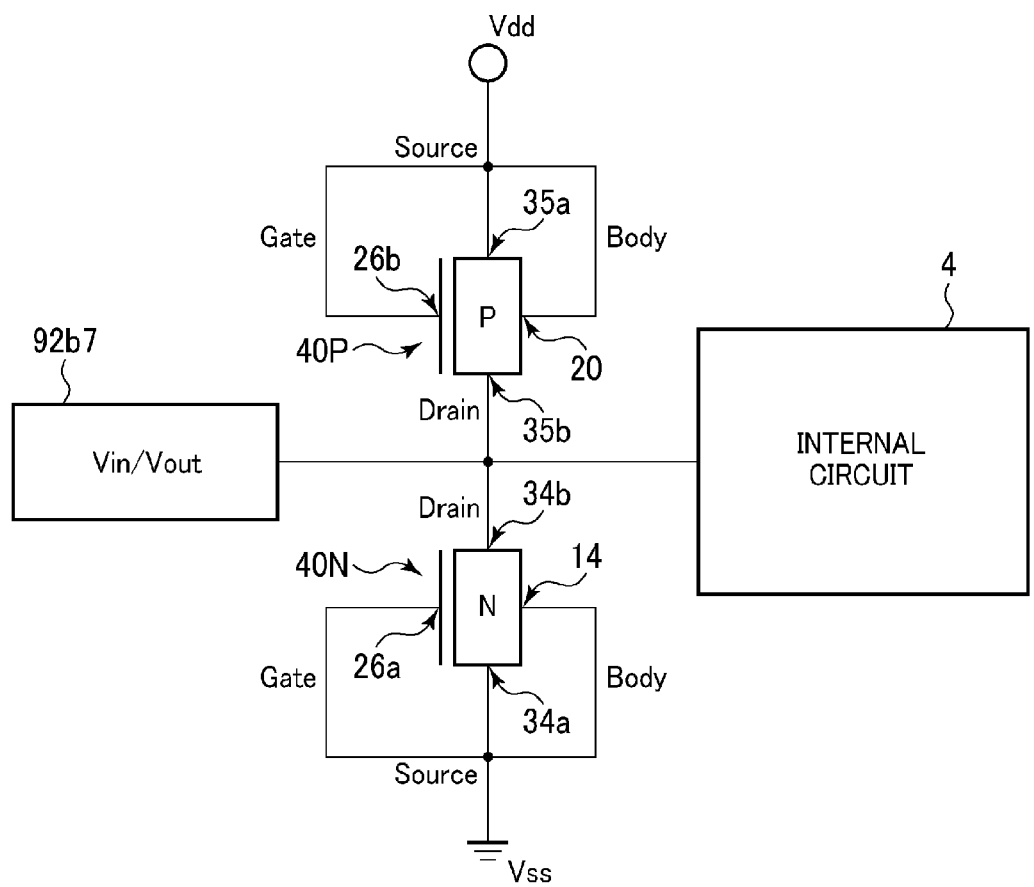
FIG. 21 is a view illustrating a circuit of a part of the semiconductor device according to the modification of the first embodiment.

Next, the semiconductor device according to a modification of the present embodiment will be described with reference to FIGS. 20 and 21. FIG. 20 is a sectional view of the semiconductor device according to the present embodiment. FIG. 21 is the circuit diagram of a part of the semiconductor device according to the present modification.

The semiconductor device according to the present modification comprises an ESD (Electro-Static Discharge) protection circuit including an N-channel type high withstand voltage transistor 40N and the P-channel type high withstand voltage transistor 40P.

As illustrated in FIGS. 20 and 21, the interconnection 92b7 for input/output signals (Vin/Vout) is electrically connected to the drain 34b of the N-channel type high withstand voltage transistor 40N and the drain 35b of the P-channel type high withstand voltage transistor 40P.

The gate electrode 26p of the P-channel type high withstand voltage transistor 40P, the source 35a of the P-channel type high withstand voltage transistor 40P and the body (the N-type well) 20 are electrically connected to the interconnection 92b9 which is to be connected to the power supply potential Vdd.

The gate electrode 26a of the N-channel type high withstand voltage transistor 40N, the source 34a of the N-channel type high withstand voltage transistor 40N and the body (the P-type well) 14 are electrically connected to the interconnection 92b8 which is to be connected to the ground potential Vss.

The drain 34b of the N-channel type high withstand voltage transistor 40N and the drain 35b of the P-channel type high withstand voltage transistor 40P are connected to an internal circuit 4.

Thus, the ESD protection circuit including the N-channel type high withstand voltage transistor 40N and the P-channel type high withstand voltage transistor 40P is constituted.

Thus, the semiconductor device according to the present embodiment is constituted.

As described above, the ESD protection circuit may be formed by using the N-channel type high withstand voltage transistor 40N and the P-channel type high withstand voltage transistor 40P.

[b] Second Embodiment

The semiconductor device according to a second embodiment and its manufacturing method will be described with reference to FIGS. 22 to 25. The same members of the present embodiment as those of the semiconductor device according to the first embodiment and its manufacturing method illustrated in FIGS. 1 to 21 are represented by the same reference numbers not to repeat or to simplify the description.

Semiconductor Device

Figure 22:
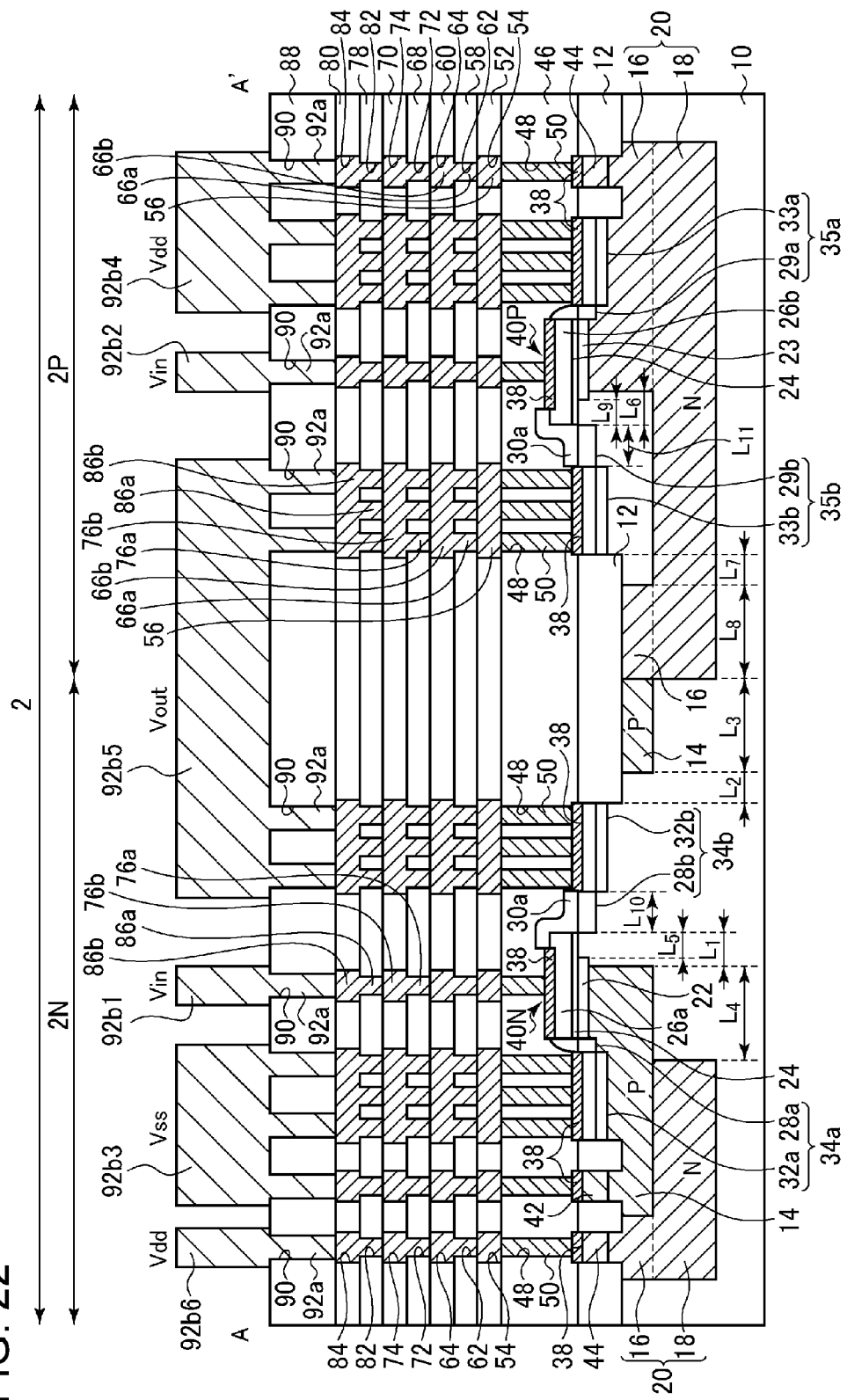
FIG. 22 is a sectional view of a semiconductor device according to a second embodiment.
Figure 24:
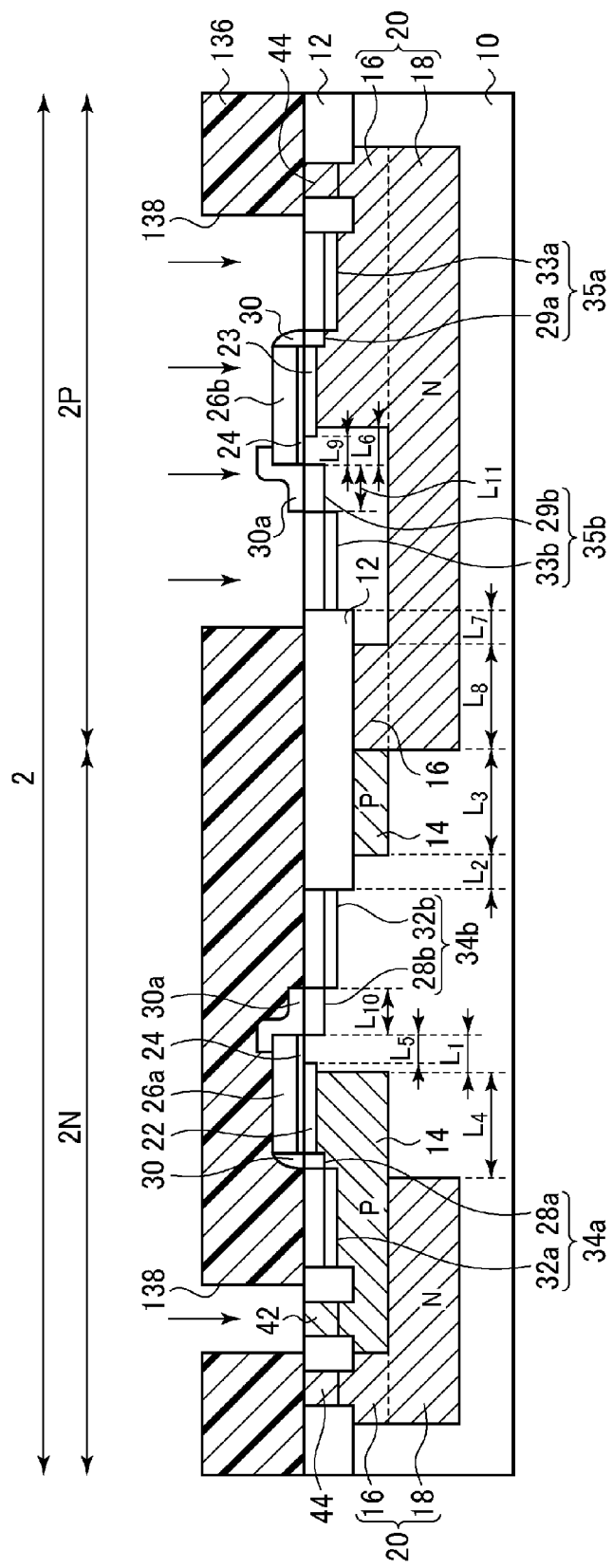

First, the semiconductor device according to the present embodiment will be described with reference to FIG. 22. FIG. 22 is a sectional view of the semiconductor device according to the present embodiment.

In the present embodiment according to the present embodiment, the distances $L_{10}$, $L_{11}$ between the gate electrodes 26a, 26b and the heavily doped drain regions 32b, 33b are set sufficiently large.

As illustrated in FIG. 22, in the semiconductor substrate 10 on both sides of the gate electrode 26a, N-type lightly doped diffused layers 28a, 28b are formed.

On the side wall of the gate electrode 26a on the side of the source diffused layer (the source region) 34a, the sidewall insulation film (the spacer) 30 is formed. On the other hand, on the part containing the side wall of the gate electrode 26a on the side of the drain diffused layer (the drain region) 34b, a spacer 30a is formed. The spacer 30a is formed, covering the side wall of the gate electrode 26a and also a part of the lightly doped drain region 28b. The spacer 30a functions as the mask (the implantation block) to prevent the implantation of a dopant impurity when the heavily doped drain region 32b is formed. When the silicide film 38 is formed, the spacer 30a functions as the mask (the silicide block) for preventing the silicidation.

In the semiconductor substrate 10 on both sides of the gate electrode 26a with the sidewall insulation film 30 and the spacer 30a formed on, the N-type heavily doped diffused layers 32a, 32b are formed. The distance $L_{10}$ between the gate electrode 26a and the N-type heavily doped diffused drain region 32b is, e.g., about 180 nm. The N-type lightly doped diffused layers 28a, 28b and the N-type heavily doped diffused layers 32a, 32b form the source/drain diffused layers 34a, 34b of the extension source/drain structure or the LDD structure. In the present embodiment, the distance $L_{10}$ between the gate electrode 26a and the heavily doped drain region 32b is set longer than the distance between the gate electrode 26a and the heavily doped source region 32a. The distance $L_{10}$ between the gate electrode 26a and the heavily doped drain region 32b is set relatively large so that the impurity profile on the side of the drain 34b can be sufficiently blunt, and the withstand voltage can be sufficient.

Thus, the N-channel type high withstand voltage transistor 40a including the gate electrode 26a and the source/drain diffused layers 34a, 34b is constituted.

In the semiconductor substrate 10 on both sides of the gate electrode 26b, the P-type lightly doped diffused layers 29a, 29b are formed.

On the side wall of the gate electrode 26b on the side of the source diffused layer 35a, the sidewall insulation film 30 is formed. On the other hand, on the part containing the side wall of the gate electrode 26b on the side of the drain diffused layer 35b, the spacer 30a is formed. The spacer 30a is formed, covering the side wall of the gate electrode 26b and also a part of the lightly doped drain region 29b.

In the semiconductor substrate 10 on both sides of the gate electrode 26b with the sidewall insulation film 30 and the spacer 30a formed on, the P-type heavily doped diffused layers 33a, 33b are formed. The distance $L_{11}$ between the gate electrode 26b and the P-type heavily doled drain region 33b is, e.g., about 180 nm. The P-type lightly doped diffused layers 29a, 29b and the P-type heavily doped diffused layers 33a, 33b form the source/drain diffused layers 35a, 35b of the extension source/drain structure or the LDD structure. In the present embodiment, the distance $L_{11}$ between the gate electrode 26b and the heavily doped drain region 33b is set larger than the distance between the gate electrode 26b and the heavily doped drain region 33b. The distance $L_{11}$ between the gate electrode 26b and the heavily doped drain region 33b is set relatively large so that the impurity profile on the side of the drain 35b can be blunt, and the withstand voltage can be sufficient.

Thus, the P-channel type high withstand voltage transistor 40b including the gate electrode 26b and the source/drain diffused layers 35a, 35b are constituted.

Evaluation Result

Next, the evaluation result of the semiconductor device according to the present embodiment will be described with reference to FIG. 4.

The ○ plots in FIG. 4 indicate a case of Example 3, i.e., the withstand voltage of the P-channel type high withstand voltage transistor 40P of the semiconductor device according to the present embodiment under the on-state. When measuring the withstand voltage under the on-state, the voltage of the gate 26b was −1.2 V, the voltage of the source 35a and the N-type well 20 were 0V, and the minus bias voltage applied to the drain 35b was gradually increased.

The Δ plots in FIG. 4 indicate a case of Example 4, i.e., the withstand voltage of the P-channel type high withstand voltage transistor 40P of the semiconductor device according to the present embodiment under the off-state. When measuring the withstand voltage under the off-state, the voltages of the gate 26b, the source 35a and the N-type well 20 were 0 V, and the minus bias voltage applied to the drain 35b was gradually increased.

As illustrated in FIG. 4, Examples 3 and 4, i.e., the semiconductor device according to the present embodiment can improve the withstand voltage in comparison with Examples 1 and 2.

Thus, according to the present embodiment, the semiconductor device can include channel high withstand voltage transistors of higher withstand voltage.

As described above, the distance $L_{10}$, $L_{11}$ between the gate electrodes 26a 26b and the heavily doped drain regions 32b, 33b may be set sufficiently large. According to the present embodiment, the impurity profiles on the sides of the drains 34b, 35b can be made blunt, and consequently, the withstand voltage can be higher.

Method for Manufacturing the Semiconductor Device

Next, the method for manufacturing the semiconductor device according to the present embodiment will be described with reference to FIGS. 23A to 25. FIGS. 23A to 25 are sectional views of the semiconductor device according to the present embodiment in the steps of the method for manufacturing the semiconductor device, which illustrate the method.

First, the step of forming the device isolation regions to the step of forming the lightly doped diffused layers 29a, 29b are the same as those of the method for manufacturing the semiconductor device according to the first embodiment described above with reference to FIGS. 11A to 15A, and their description will not be repeated.

Next, a silicon oxide film of, e.g., a 100 nm-film thickness is formed on the entire surface by, e.g., CVD.

Next, a photoresist film 130 is formed on the entire surface by, e.g., spin coating.

Then, the photoresist film 130 is patterned by photolithography. Thus, the photoresist film 130 for forming the spacer 30a is formed (see FIG. 23A).

Then, with the photoresist film 130 as the mask, the silicon oxide film is etched. Thus, the sidewall insulation film 30 of silicon oxide film is formed on the side walls of the gate electrodes 26a, 26b on the side of the lightly doped source regions 28a, 29a. The spacer 30a of silicon oxide film is formed on the parts containing the side walls of the gate electrodes 26a, 26b on the side of the lightly doped drain regions 28b, 29b. The spacer 30a functions as the mask (the implantation block) for preventing the implantation of dopant impurities. The spacer 30a functions as the mask (the silicide block) for preventing the silcidation when the silicide film 38 is formed. Accordingly, the spacer 30a is formed on the side walls of the gate electrodes 26a, 26b and also parts of the lightly doped drain regions 28b, 29b. The distances $L_{10}$, $L_{11}$ between the gate electrodes 26a, 26b and the edges of the spacer 30a are, e.g., about 180 nm.

Next, a photoresist film 132 is formed on the entire surface by, e.g., spin coating.

Then, the photoresist film 132 is patterned by photolithography. Thus, the openings 134 for respectively exposing the N-channel type high withstand voltage transistor-to-be-formed region 2N and the region where the N-type contact regions (the well tap regions) 44 is to be formed are formed in the photoresist film 132 (see FIG. 23B).

Then, by, e.g., ion implantation with the photoresist film 132, the gate electrode 26a, the sidewall insulation film 30 and the spacer 30a as the mask, an N-type dopant impurity is implanted into the semiconductor substrate 10. Thus, the N-type heavily doped diffused layers 32a, 32b and the N-type contact regions 44 are formed. The N-type drain region 32b is formed, sufficiently spaced from the gate electrode 26a. The distance $L_{10}$ between the gate electrode 26a and the heavily doped drain region 32b is set larger than the distance between the gate electrode 26a and the heavily doped source region 32a. The lightly doped diffused layers 28a, 28b and the heavily doped diffused layers 32a, 32b form the source/drain diffused layers 34a, 34b of the extension source/drain structure or the LDD structure.

Then, the photoresist film 132 is released by, e.g., asking.

Next, a photoresist film 136 is formed on the entire surface by, e.g., spin coating.

Next, the photoresist film 136 is patterned by photolithography. Thus, the openings 138 for respectively exposing the P-channel type high withstand voltage transistor-to-be-formed region 2P and the region where the P-type contact region (the well tap region) 42 is to be formed is formed in the photoresist film 136 (see FIG. 24).

Next, by, e.g., ion implantation with the photoresist film 136, the gate electrode 26b, the sidewall insulation film 30 and the spacer 30a as a mask, a P-type dopant impurity is implanted into the semiconductor substrate 10. Thus, the P-type heavily doped diffused layers 33a, 33b and the P-type contact region 42 are formed. The P-type drain region 33b is formed, sufficiently spaced from the gate electrode 26b. The distance $L_{11}$ between the gate electrode 26b and the heavily doped drain region 33b is set larger than the distance between the gate electrode 26b and the heavily doped source region 33a. The lightly doped diffused layers 29a, 29b and the heavily doped diffused layers 33a, 33b form the source/drain diffused layers 35a, 35b of the extension source/drain structure or the LDD structure.

Then, the photoresist film 136 is released by, e.g., asking.

The following steps of the method for manufacturing the semiconductor device are the same as those of the method for manufacturing the semiconductor device according to the first embodiment illustrated in FIGS. 17A to 19, and their description will not be repeated.

Thus, the semiconductor device according to the present embodiment is manufactured (see FIG. 25).

Modified Embodiments

The present invention is not limited to the above-described embodiments and can cover other various modifications.

For example, in the above-described embodiments, the semiconductor substrate 10 is a P-type semiconductor substrate, and the conduction type of the semiconductor substrate 10 is not limited to P-type. For example, an N-type semiconductor substrate may be used. When an N-type semiconductor substrate is used, the conduction types of the respective constituent members described above are reversed.

The second embodiment is described above by means of the CMOS inverter using the N-channel type high withstand voltage transistor 40N and the P-channel type high withstand voltage transistor 40P, but this is not essential. For example, an ESD protection circuit may comprise the N-channel type high withstand voltage transistor 40N and the P-channel type high withstand voltage transistor 40P (refer to the modification of the first embodiment).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a first gate electrode formed over a first region of a semiconductor substrate of a first conduction type, where a first transistor is to be formed, with a first gate insulation film formed therebetween;
   a first source region of the first conduction type formed in the semiconductor substrate on one side of the first gate electrode;
   a first drain region of the first conduction type formed in the semiconductor substrate on the other side of the first gate electrode;
   a first channel dope layer of a second conduction type formed in at least a region on a side of the first source region of a first channel region between the first source region and the first drain region, the first channel dope layer having, at a part of the first channel dope layer on a side of the first drain region, a concentration gradient of a concentration of a dopant impurity of the second conduction type, which decrease toward the first drain region;
   a first well of the second conduction type formed in a region of the first region except a region where the first drain region is to be formed, the first well having, at a part of the first well on a side of the first drain region, a concentration gradient of a concentration of a dopant impurity of the second conduction type, which decrease toward the first drain region; and
   a second well of the second conduction type formed in the first region, connected to the first well and positioned below the first well.

2. The semiconductor device according to claim 1, further comprising:
   a second gate electrode formed over a second region of the semiconductor substrate, where a second transistor is to be formed, with a second gate insulation film formed therebetween;
   a second source region of the second conduction type formed in the semiconductor substrate on one side of the second gate electrode;
   a second drain region of the second conduction type formed in the semiconductor substrate on the other side of the second gate electrode;
   a second channel dope layer of the first conduction type formed in at least a region on a side of the second source region of a second channel region between the second source region and the second drain region, the second channel dope layer having, at a part of the second channel dope layer on a side of the second drain region, a concentration gradient of a concentration of a dopant impurity of the first conduction type, which decrease toward the second drain region; and
   a third well of the first conduction type formed in a region of the second region except the region where the second drain region is to be formed, the third well having, at a part of the third well on a side of the second drain region, a concentration gradient of a concentration of a dopant impurity of the first conduction type, which decrease toward the second drain region.

3. The semiconductor device according to claim 2, wherein
   the first well is formed so that the first well further enclose a side of the third well,
   the second well is further formed below the third well, and
   a distance between the second drain region and the second well is larger than a distance between the second drain region and the third well.

4. The semiconductor device according to claim 1, wherein
   the first source region includes a lightly doped source region of the first conduction type, and a heavily doped source region of the first conduction type, whose impurity concentration is higher than that of the lightly doped source region,
   the second drain region includes a lightly doped drain region of the first conduction type, and a heavily doped drain region of the first conduction type, whose dopant impurity is higher than that of the lightly doped drain region, and
   a distance between the first gate electrode and the heavily doped drain region is larger than a distance between the first gate electrode and the heavily doped source region.

5. The semiconductor device according to claim 1, wherein the first drain region and the first channel dope layer are spaced from each other.

6. The semiconductor device according to claim 1, wherein the first drain region and the first channel dope layer are spaced from each other on a design data or on a reticle.

7. A method for manufacturing a semiconductor device comprising:
   forming a first channel dope layer of a second conduction type in a first region of a semiconductor substrate of a first conduction type, where a first transistor is to be formed, the first channel dope layer being formed in a region except a first prescribed region where a dopant impurity for forming a first drain region of the first transistor is to be implanted so that the first channel dope layer is spaced from the first prescribed region;
   forming a first well of the second conduction type in a region of the first region except the first prescribed region so that the first well is spaced from the first prescribed region;
   forming a second well of the second conduction type to be connected to the first well in the first region so that the second well is positioned below the first well;
   forming a first gate electrode of the first transistor over the semiconductor substrate in the first region with a first gate insulation film formed therebetween; and
   forming a first source region of the first conduction type of the first transistor in the semiconductor substrate on one side of the first gate electrode, and forming the first drain region of the first conduction type in the first prescribed region of the semiconductor substrate on the other side of the first gate electrode.

8. The method for manufacturing the semiconductor device according to claim 7, further comprising:
   forming a second channel dope layer of the first conduction type in a second region of the semiconductor substrate, where a second transistor is to be formed, the second channel dope layer being formed in a region except a second prescribed region where a dopant impurity for forming a second drain region of the second transistor is to be implanted so that the second channel dope layer being spaced from the second prescribed region; and forming a third well of the first conduction type in a region of the second region except the second prescribed region so that the third well is spaced from the second prescribed region;

in forming the first gate electrode, a second gate electrode of the second transistor is formed on the semiconductor substrate in the second region with a second gate insulation film formed therebetween, and forming a second source region of the second transistor in the semiconductor substrate on one side of the second gate electrode, and the second drain region in the second prescribed region of the semiconductor substrate on the other side of the second gate electrode.

9. The method for manufacturing the semiconductor device according to claim 8, wherein in forming the first well, the first well is formed so that the first well further encloses the third well, and in forming the second well, the second well is further formed also below the third well so that a distance between the second drain region and the second well is larger than a distance between the second drain region and the third well.

10. The method for manufacturing the semiconductor device according to claim 7, wherein the forming the first source region comprises:

implanting a dopant impurity of the first conduction type into the semiconductor substrate with the first gate electrode as a mask to form a lightly doped source region in the semiconductor substrate on one side of the first gate electrode and a lightly doped drain region in the semiconductor substrate on the other side of the first gate electrode;

forming a first spacer on a side wall of the first gate electrode on said one side and a second spacer at least on a side wall of the first gate electrode on said the other side;

implanting a dopant impurity of the first conduction type into the semiconductor substrate with the first gate electrode, the first spacer and the second spacer as a mask to form a first heavily doped source region whose impurity concentration is higher than that of the first lightly doped source region in the semiconductor substrate on said one side of the first gate electrode so that the first heavily doped source region is spaced from the side wall of the first gate electrode on said one side by a first distance and form a second heavily doped drain region whose impurity concentration is higher than that of the first lightly doped drain region in the semiconductor substrate on said the other side of the first gate electrode so that the second heavily doped drain region is spaced from the side wall of the first gate electrode on said the other side by a second distance larger than the first distance.

* * * * *